US009207540B1

(12) United States Patent
Bhargava et al.

(10) Patent No.: US 9,207,540 B1
(45) Date of Patent: Dec. 8, 2015

(54) INTEGRATING FUNCTIONAL AND FLUIDIC CIRCUITS IN JOULE-THOMSON MICROCOOLERS

(71) Applicant: LOCKHEED MARTIN CORPORATION, Bethesda, MD (US)

(72) Inventors: Krisna Bhargava, San Jose, CA (US); Mark Goodnough, Santa Ynez, CA (US); Elna Saito, Santa Barbara, CA (US); Jeffrey W. Scott, Santa Barbara, CA (US); James Kreider, Goleta, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/727,505

(22) Filed: Jun. 1, 2015

Related U.S. Application Data

(60) Provisional application No. 62/005,252, filed on May 30, 2014.

(51) Int. Cl.
*C23F 1/00* (2006.01)
*G03F 7/36* (2006.01)
*C23F 3/00* (2006.01)

(52) U.S. Cl.
CPC ... *G03F 7/36* (2013.01); *C23F 1/00* (2013.01); *C23F 3/00* (2013.01)

(58) Field of Classification Search
CPC ............ H01L 2924/0002
USPC ............ 216/2
See application file for complete search history.

(56) References Cited

U.S. PATENT DOCUMENTS 3,912,557 A 10/1975 Hochberg
4,386,505 A 6/1983 Little
4,392,362 A 7/1983 Little
(Continued)

FOREIGN PATENT DOCUMENTS

EP 0 337 802 10/1989
WO 2013016224 1/2013

OTHER PUBLICATIONS

Baine et al., "Thermal vias for SOI Technology," Proc ICCCD International Conference on Communications, Computers and Devices, Kharagpur, India, 2000, p. 239-242.
(Continued)

*Primary Examiner* — Roberts Culbert
(74) *Attorney, Agent, or Firm* — Terry M. Sanks, Esq.; Beusse Wolter Sanks & Maire, PLLC

(57) ABSTRACT

A method includes etching one or more fluidic channels into a first substrate made of a first material according to a first spatial pattern. The method also includes, after etching the fluidic channels, then separately etching a space in the first substrate according to a different second pattern that includes at least one connection between at least two different portions of the fluidic channels. The method still further includes depositing a different second material into the space. The method yet further includes bonding a different second substrate to the first substrate to enclose the fluidic channels to configure them to contain or pass one or more fluids. For fabricating a Joule-Thomson cooler, the first substrate is made of a first thermally insulating material; the second material is a thermally conducting material; and the second substrate is made of a second thermally insulating material.

22 Claims, 15 Drawing Sheets

(56) References Cited

U.S. PATENT DOCUMENTS

| | | | | |
|---|---|---|---|---|
| 4,489,570 | A | 12/1984 | Little | |
| 5,239,200 | A | 8/1993 | Messina et al. | |
| 5,611,214 | A | 3/1997 | Wegeng et al. | |
| 5,974,808 | A | 11/1999 | Mangano et al. | |
| 6,213,194 | B1 | 4/2001 | Chrysler et al. | |
| 7,118,711 | B1 * | 10/2006 | Koehler | 422/534 |
| 8,141,556 | B2 | 3/2012 | Ruben | |
| 2007/0209371 | A1 | 9/2007 | Sobel | |
| 2007/0245749 | A1 | 10/2007 | Atkins et al. | |
| 2009/0193817 | A1 | 8/2009 | Germain et al. | |
| 2010/0283854 | A1 | 11/2010 | McKaughan et al. | |
| 2012/0309127 | A1 | 12/2012 | Farooq et al. | |

OTHER PUBLICATIONS

Pope et al., "Development of a Two-Stage Alternate Joule-Thomson Cryo-Cooler for AAWS-M Risk Reduction," No. AMSMI-TR-RD-AS-91-22. Army Missile Command Redstone Arsenal AL Advances Sensors Directorate, 1991, p. 1-22.

Little et al., "Microminiature refrigeration," AIP Conference Processings. vol. 985. No. 1. 2008.

Pradeep et al., "Analysis of Performance of Heat Exchangers used in Practical Micro Miniature refrigerators," Cryogenics 39.6 1999, p. 517-527.

Lerou et al., "All Micromachined Joule-Thomson Cold Stage," 2007 p. 437-441.

Little et al., "Development of Low Cost, Cryogenic Refrigeration System for Cooling of Cryoelectronics," Advances in Cryogenic Engineering, Springer US, 1994, p. 1467-1474.

Chorowski et al., "Development and Testing of a Miniature Joule-Thomson Refrigerator with Sintered Powder Heat Exchanger," Advances in Cryogenic Engineering, Springer US, 1994, p. 1475-1481.

Lyon et al., "Linear Thermal Expansion Measurements on Silicon from 6 to 340 K," Journal of Applied Physics 48.3, 1977, p. 865-868.

McConnell et al., "Thermal Conductivity of Doped Polysilicon Layers," Microelectromechanical Systems, Journal of 10.3, 2001 p. 360-369.

Kumar et al., "Some Studies on Manufacturing and Assembly Aspects of Miniature J-T Coolers with Specific Regard to the Performance for Small Heat loads," IJEST, Jan. 2011, pp. 660-664, vol. 3, No. 1, Metcalfe House Delhi, India.

Tzabar et al., "Development of Miniature Fast Cool Down J-T Cryocooler," J-T and Sorption Cryocooler Developments, 2011, pp. 473-480, Int'Cryocooler Conference, Inc., Boulder CO.

Zhu et al., "A Planar Glass/SI Micromachining Process for the Heat Exchanger in a J-T Cryosurgical Probe," Dept. of Mech. Engineering, Feb. 2008, Madison, WI.

* cited by examiner

INTEGRATING FUNCTIONAL AND FLUIDIC CIRCUITS IN JOULE-THOMSON MICROCOOLERS

CROSS-REFERENCE TO RELATED APPLICATIONS

This application claims the benefit of U.S. Provisional Application No. 62/005,252 filed May 30, 2014, and is incorporated herein by reference in its entirety.

BACKGROUND

As used here, a fluidic channel refers to a channel configured to carry a fluid in a substrate. Some devices require that fluidic channels be connected by a functional material different from a substrate material used to form the channels. For example, in some Joule-Thomson (JT) cryocoolers, in which a gas under pressures adiabatically expands through a nozzle into a chamber of lower pressure, the high pressure gas is thermally conditioned before entering the chamber by the temperature of the low pressure exhaust gases, a design known as heat exchange. A cryocooler implies a device designed to cool to very low temperatures, such as −150 degrees Celsius (° C.) or 130 Kelvin (K), and below. The thermal conditioning is accomplished, for example, through a thermally conductive material (as the functional material) to support heat exchange. The thermally conductive material is different from the material serving as a substrate for channels, which is thermally insulating in order to support the adiabatic expansion.

When the fluidic channels are on the microscale (cross sectional dimensions from about 1 to about 1000 microns, 1 micron=$10^{-6}$ meters) or nanoscale (cross sectional dimensions from about 1 to about 1000 nanometers, nm, 1 nm=$10^{-9}$ meters) fabrication become challenging. In such cases, the functional material is often formed into a second layer, separate from a wafer serving as the substrate for the fluidic channels. A cover for the channels, with any reservoirs or access ports, is then formed in a third layer. The multilayer fabrication introduces complexity and expense in having three or more fabrication configurations and introduces challenges in alignment of the separately fabricated layers.

For example, some microscale JT cryocoolers have been fabricated using Micro-Electro-Mechanical Systems (MEMS) or Nano-Electro-Mechanical Systems (NEMS) micromachining, and semiconductor processing methods. These fabrication methods involve the use of three or more wafers as substrates to achieve the effective integration of fluidic circuits, and do not allow for the integration of thermally conductive material useful for such thermal conditioning as in a regenerative cooling design. The fabrication techniques involved (e.g., deep reactive ion etching, microparticle sand blasting, selective laser ablation) are highly complex, specialized, expensive, and often difficult to maintain in a manufacturing mode.

SUMMARY

Techniques are provided for a repeatable, flexible, and economical fabrication process that enables industrial adoption for manufacture of devices having fluidic channels at the microscale and nanoscale connected by a functional material separate from a substrate, such as for manufacture of devices comprising microfluidic JT cryocooler technologies (also called JT microcoolers herein). In some of these embodiments, the functional material is introduced for increased thermal conductivity. In other embodiments, the functional material is introduced for other functions, such as electrical conduction to reduce voltage buildup or to harvest current from a battery, or introduced for filtering to remove particles of a particular size or chemical composition from the fluid, or introduced to allow diffusion of one or more chemical constituents from high to low free energy in a fluidic circuit.

In a set of embodiments, a method includes etching one or more fluidic channels having at least two different portions into a first substrate made of a first material according to a first spatial pattern. The method also includes, after etching the one or more fluidic channels, then separately etching a space in the first substrate according to a different second pattern that includes at least one connection between the at least two different portions of the one or more fluidic channels. The method still further includes depositing a different second material into the space. The method yet further includes bonding a different second substrate to the first substrate to enclose the one or more fluidic channels to configure the one or more fluidic channels to contain or pass one or more fluids.

In some embodiments for fabricating a Joule-Thomson cooler, the first substrate is made of a first thermally insulating material; the second material is a different thermally conducting material; and the second substrate is made of a second thermally insulating material In some embodiments for fabricating the Joule-Thomson cooler, the method also includes, before bonding the different second substrate, applying chemical-mechanical polishing to grind the thermally conducting second material to a bonding level of the first substrate.

In some embodiments for fabricating the Joule-Thomson cooler, the method further includes before bonding the different second substrate, etching one or more fluidic channels into the second substrate according to a complementary spatial pattern that causes the one or more fluidic channels in the second substrate to align with the one or more fluidic channels in the first substrate.

In some embodiments for fabricating the Joule-Thomson cooler, the method further includes, before bonding the different second substrate, depositing a sealing material on one or both of the first and second substrate.

BRIEF DESCRIPTION OF THE DRAWINGS

A more particular description than the description briefly stated above is rendered by reference to specific embodiments thereof that are illustrated in the appended drawings. Understanding that these drawings depict only example embodiments and are not therefore to be considered to be limiting of its scope, various embodiments are described and explained with additional specificity and detail through the use of the accompanying drawings in which.

DETAILED DESCRIPTION

Figure 1A:
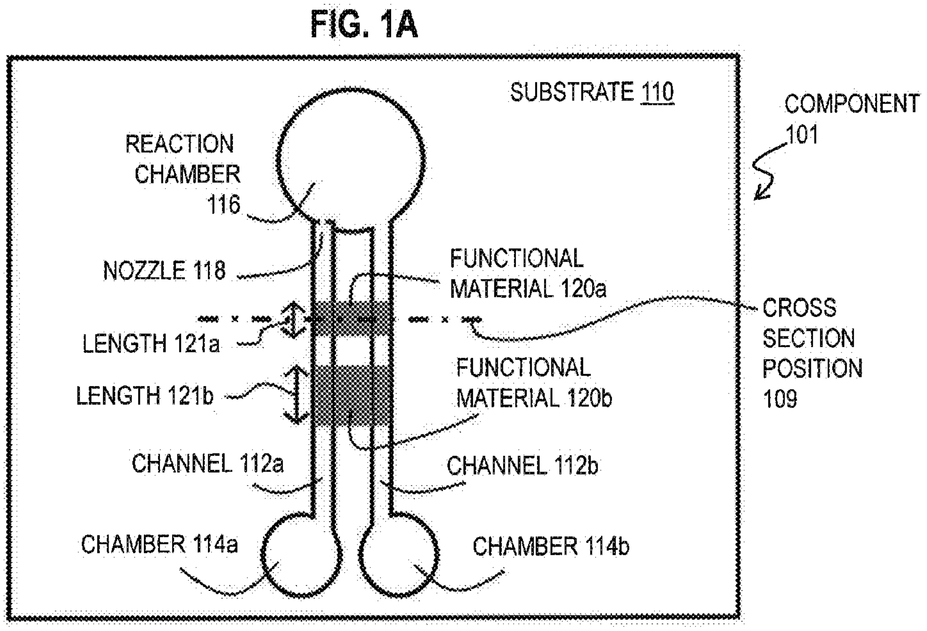
FIG. 1A is a block diagram that illustrates a non-limiting example of a first component of a fluidic device, according to an embodiment.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

Although some example embodiments are described below in the context of JT microcoolers, the methods of fabrication and resulting devices are not limited to such technology. In other embodiments, the methods and devices are utilized in other technologies that advantageously use functionalized fluidic devices, on the nanoscale or microscale or larger scales, such as batteries, environmental or medical testing equipment, chemical manufacture, chemical processing, water treatment, medical treatment, sensors, transducers, bioanalytical instruments, and any variety of fluid-handling systems.

FIG. 1A is a block diagram that illustrates an example first component 101 of a fluidic device, according to an embodiment. The first component 101 includes one or more fluidic channels, such as channels 112*a* and 112*b* (collectively referenced hereinafter as channels 112) formed in a substrate 110. In other embodiments, more or fewer channels are included, such as a single winding channel that folds back on itself to form a series of parallel channel portions. In the illustrated embodiment, the component 101 includes, in substrate 110, a reaction chamber 116 and one or more supply and exhaust chambers, such as chambers 114*a* and 114*b*, collectively referenced hereinafter as chambers 114. In other embodiments more or fewer or no chambers are included.

For example, in a JT microcooler, the channels 112 are microfluidic channels or nanofluidic channels or some combination. Non-ideal gas in the supply chamber 114 is under pressure and passes through nozzle 118 into the reaction chamber 116 at low pressure. In the reaction chamber 116, the non-ideal gas undergoes adiabatic (no exchange of heat) expansion, so the substrate 110 is advantageously made of a material that is thermally insulating. The low pressure gas (still a fluid) is the reaction product and is then used for cooling, e.g., for cooling of a contacting heat source built independent of the substrate. For example, some or all of the low temperature gas pass through an access port (depicted below with reference to FIG. 1B) in fluid communication with the reaction chamber and brought in contact with a heat exchanger to cool some object, such as an infrared detector. In some embodiments, some or all of the fluid from the reaction chamber, such as the product or a waste product or some combination, flow to an exhaust chamber, e.g., chamber 114*b*, for expulsion through another access port (e.g., depicted below with reference to FIG. 1B).

The component 101 also includes one or more functional materials deposited on the substrate in order to connect at least two portions of the channels 112. In the illustrated embodiment, functional material 120*a* is disposed on the substrate 110 to connect a portion of length 121*a* of channel 112*a* with a portion of channel 112*b*; and, functional material

120*b* is disposed on the substrate 110 to connect a different portion of length 121*b* of channel 112*a* with a different portion of channel 112*b*. In some embodiments, the functional materials 120*a*, 120*b* (collectively referenced hereinafter as functional material 120) and lengths 121*a*, 121*b* (collectively referenced hereinafter as length 121) are different. In some embodiments, the functional materials deposited in different parts of the substrate 110 of component 101 are the same and the lengths 121 are either also the same or are different. The type of functional material, the area of contact of the functional material with each portion of the channels 112 connected, and the length 121 and thickness of the material over the substrate barrier dividing the two portions are all selected to perform the desired function at a desired rate suitable for a given purpose, and can be determined by experiment or simulation. By depositing the functional material directly on the same substrate 110 that forms the channels, the component 101 obviates the need for an additional substrate used in previous approaches to provide the functional material, or its corresponding function. Later drawings depict example cross sections of component 101 or fabrication thereof at cross section position 109.

Figure 1B:
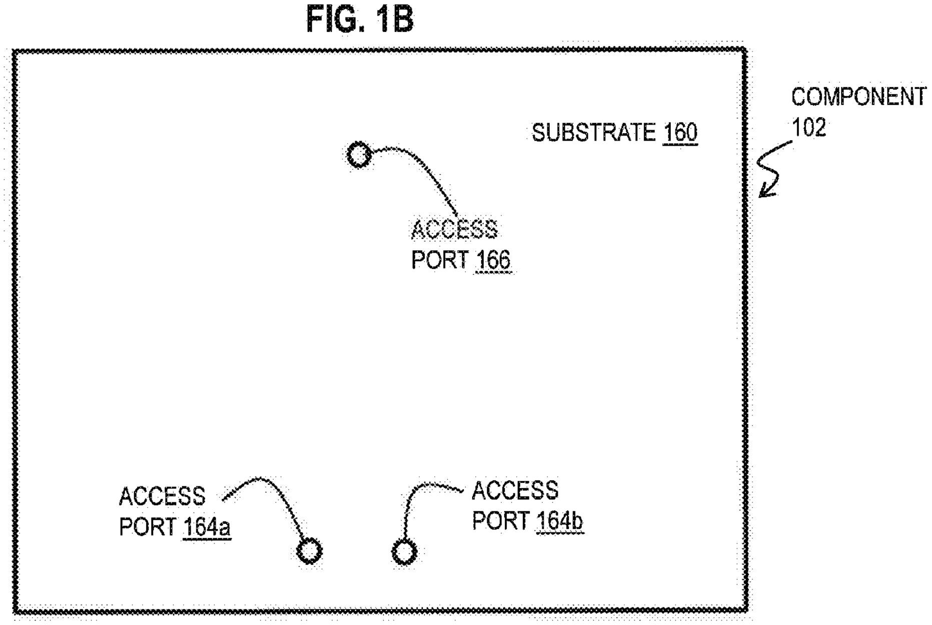
FIG. 1B is a block diagram that illustrates a non-limiting example of a second component of a fluidic device, according to an embodiment.

By itself, component 101 has fluidic channels that are open to a surface of the substrate 110, and therefore not suitable for most purposes, including for gas fluids, or fluids that are advantageously shielded from an external environment. FIG. 1B is a block diagram that illustrates an example second component 102 of a fluidic device, according to an embodiment. The second component, also called a capping component, includes a second substrate 160 configured to be bonded to a bonding surface of the first substrate in order to enclose the one or more fluidic channels in the first substrate 110. Access ports for the channels in the first component 101 are advantageously formed in the substrate 160 of second component 102 to protect from the port formation process, such as drilling, any delicate features in the first component, such as, in some embodiments, microchannels or nanochannels or functional material connected thereto. In the illustrated embodiment, access ports 164*a*, 164*b* and 166 are configured to provide access to chambers 114*a*, 114*b* and 116, respectively. Any method may be used to form access ports.

Figure 1C:
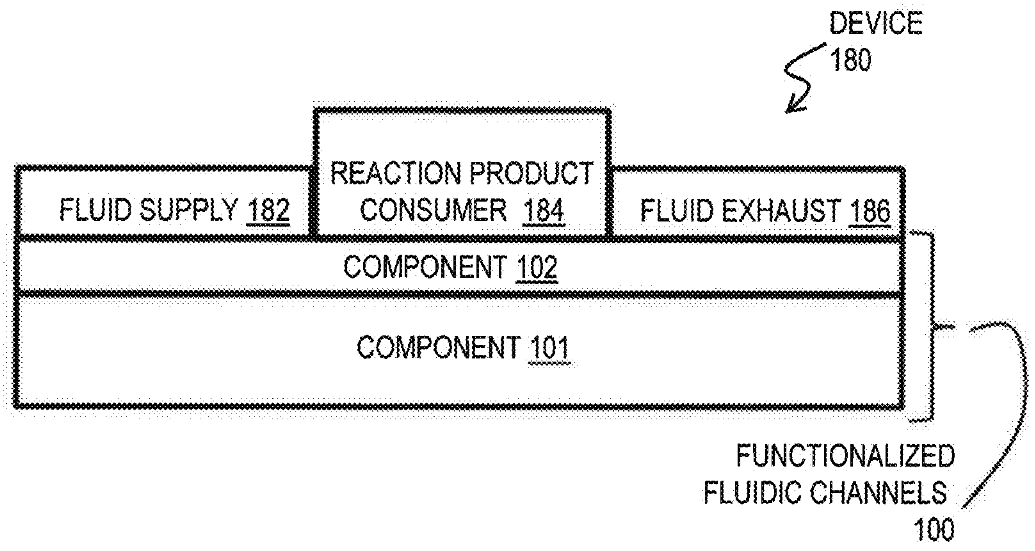
FIG. 1C is a block diagram that illustrates a non-limiting example of a fluidic device, according to an embodiment.

FIG. 1C is a block diagram that illustrates an example fluidic device 180, according to an embodiment. FIG. 1C depicts, in elevation view, component 102 bonded to component 101 to enclose the fluidic channels in component 101 and thus confine fluid flow within the one or more fluidic channels. The combination of the two components 101 and 102 provides what is termed herein functionalized fluidic channels 100 also called functionalized fluid circuits. Device 180 includes a fluid supply component 182, a reaction product consumer component 184, and a fluid exhaust component 186 in fluid communication with the functionalized fluidic channels 100.

The access ports in component 102 connect the fluidic channels in component 101 to one or more other components of the device. The other components include fluid supplies, such as fluid supply component 182; one or more consumers of reaction product, such as reaction product consumer component 184; and zero or more fluid exhausts, including the ambient environment, such as fluid exhaust component 186. As a non-limiting example, in a JT microcooler, the fluid supply 182 is a gas mixture under pressure; consumer component is a cryostat 184, such as a metallic cold finger into which at least some of the cold expanded low-pressure gas is routed; and fluid exhaust 186 is an opening to the environment or to a return line through a compressor.

Figure 1D:
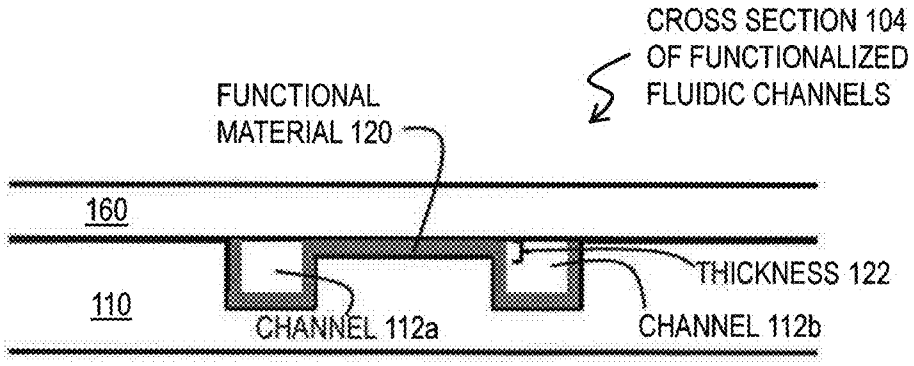
FIG. 1D is a block diagram that illustrates a non-limiting example of a cross section through functionalized fluidic channels, according to an embodiment.

FIG. 1D is a block diagram that illustrates a non-limiting example of a cross section 104 through functionalized fluidic channels 100, according to an embodiment. This cross section is positioned apart from any access ports, so that component 102 here comprises only capping substrate 160. This cross section is positioned where a functional material connects two portions of one or more channels, such as cross section position 109 where functional material 120*a* connects a portion of channel 112*a* to a portion of channel 112*b*. In the illustrated embodiment, the functional material 120 connects channel 112*a* to channel 112*b* at the chosen cross section in a layer of thickness 122. In the illustrated embodiment, the functional material also lines both side walls and the floor of the connected portions of the channels 112. However, in other embodiments, less than three walls are covered by the functional material. In some embodiments, the functional material only connects to one or both channels by the length 121 and thickness 122 of the functional material on the substrate barrier between the two channel portions.

A bonding surface of substrate 160 is configured to contact a bonding surface of substrate 110; and, thus the substrate 160 of capping component 102 is configured to close off the channels in substrate 110 of fluidic circuitry component 101. The thickness 122 of the functional material 120 between the channel portions advantageously matches the distance from the top of the substrate 110 between the connected channel portions and the bonding surface of substrate 160. Note that two substrates suffice to provide the functionalized fluidic channels, reducing the number of substrates that have to be processed during manufacture, compared to previous approaches using three or more substrates.

Figure 1E:
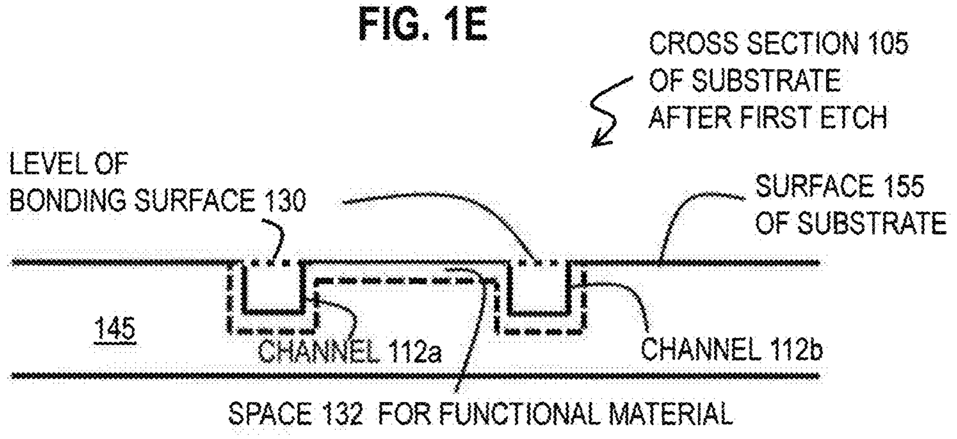
FIG. 1E is a block diagram that illustrates a non-limiting example of a cross section through a first substrate after a first etch, according to an embodiment.

The next three drawings depict intermediate steps in the fabrication of the first component 101. FIG. 1E is a block diagram that illustrates a non-limiting example of a cross section 105 through a first substrate after a first etch, according to an embodiment. The first etch acts on a wafer of a first material for the first substrate. Any suitable material may be used for the intended purpose. A glass or quartz wafer is used in many embodiments because glass and quartz forms fairly stiff wafers and is easily etched by many well-known integrated circuit and MEMS/NEMS techniques. Typically, both glass and quartz contain various oxides of silicon, with the former arranged in an amorphous structure while the latter includes one or more crystals of one or more silicon oxides (silicon monoxide or silicon dioxide, or both). Two advantages of glass for JT microcoolers are that glass is thermally insulating for the adiabatic expansion and glass is transparent, which aids in properly aligning the second substrate and any access holes. Other materials used for the first substrate include any ceramics and plastics, such as low temp-co ceramics, hard silicates like mica, plastics, epoxies, and possibly composites. For JT cooler applications, such materials with good thermal resistivity are advantageous.

The wafer is typically capable of holding many copies of the first component. The cross section 105 depicts two different portions of one or more channels in at least a part of one copy of the first component, such as the cross section 109 depicted in FIG. 1A. The surface of the wafer before etching defines a bonding surface 130. In FIG. 1E the wafer has been etched leaving a substrate 145 having a surface 155 that includes two channels, such as channel 112*a* and channel 112*b*. The level of the bonding surface 130 across the open channels 112 indicates where the second substrate 160 of the second component 102 will close off an open side of the channels 112 and confine fluid flow to stay within the channels 112. Also depicted in FIG. 1E is a space 132 to be occupied by the functional material 120. After the first etch, the space 132 is still filled with the first material of the first substrate.

Any method to selectively etch away the first material of the first substrate may be used. Non-limiting examples include: acid etching, plasma etching, deep reactive ion etching, microparticle sand blasting, selective laser ablation, gas etching, and arc discharge etching.

Figure 1F:
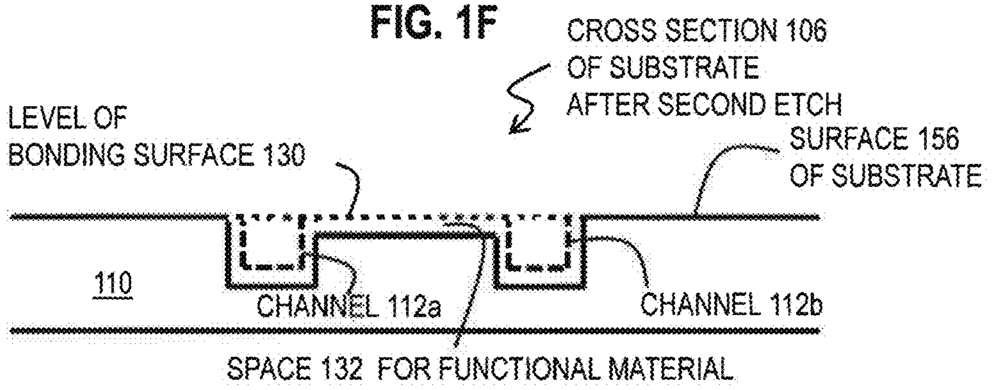
FIG. 1F is a block diagram that illustrates a non-limiting example of a cross section through the first substrate after a second etch, according to an embodiment.

FIG. 1F is a block diagram that illustrates a non-limiting example of a cross section 106 through the first substrate after a second etch, according to an embodiment. This etch has formed the final substrate 110 of the first material. The substrate 110 has a surface 156 that includes two deepened channels surrounding channel 112*a* and channel 112*b* and a reduced height substrate barrier between them. The difference between the surface 155 after the first etch and the surface 156 after the second etch is the space 132 to be occupied by the functional material 120. After the second etch, the space 132 is unfilled.

Figure 1G:
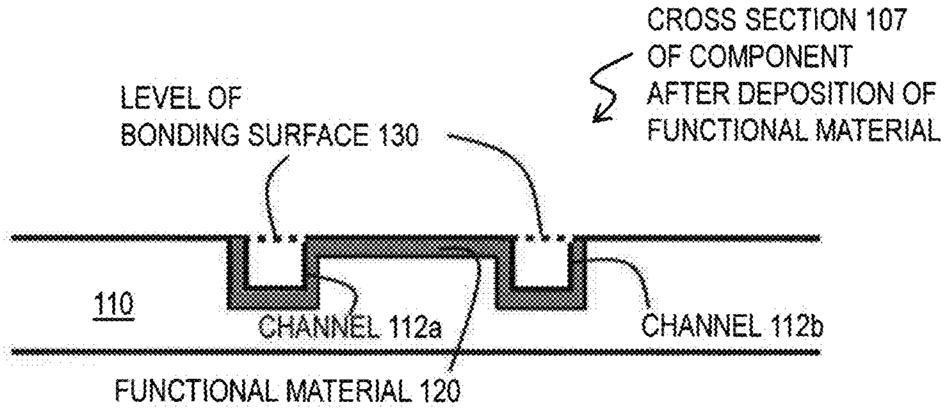
FIG. 1G is a block diagram that illustrates a non-limiting example of a cross section through the first component, according to an embodiment.

FIG. 1G is a block diagram that illustrates a non-limiting example of a cross section 107 through the first component, according to an embodiment. This cross section 107 is formed after the functional material 120 is deposited in the space 132 above substrate 110. The upper surface of the functional material forms the floor and side walls of the channels 112 and rises to the level of the bonding surface 130 above the barrier between the two channels. The functional material now connects the two portions of the channels 112. The first component 101 is now ready to be bonded to the capping component 102, such as substrate 160, to close off the channels and confine fluid flow to within the channels 112. The functional material is advantageously more solid than the fluids passing through the channel in order to confine the fluid to the channel; and, is typically a solid at operating temperatures.

Any suitable material different from the first material may be used as the functional material. Metals Ni, Cr, Ti, Au, Al, Ag, In, Sn, W, ITO, and others which can be deposited using thin film methods serve as thermal and electrical conductors. Miscellaneous materials such as SiN, SiO, Si, Si(poly), Ge, Si(doped p or n) can serve as semiconductors and optical absorbers or emitters. Silicones, epoxies, hydrogels, aerogels, papers, salt bridges, packed powders, impregnated ceramics, impregnated plastics can be used to impart filtering and permeability functionality or matrices for chemical reactions. Any method to deposit the functional material 120 in the space 132 may be used.

Figure 2:
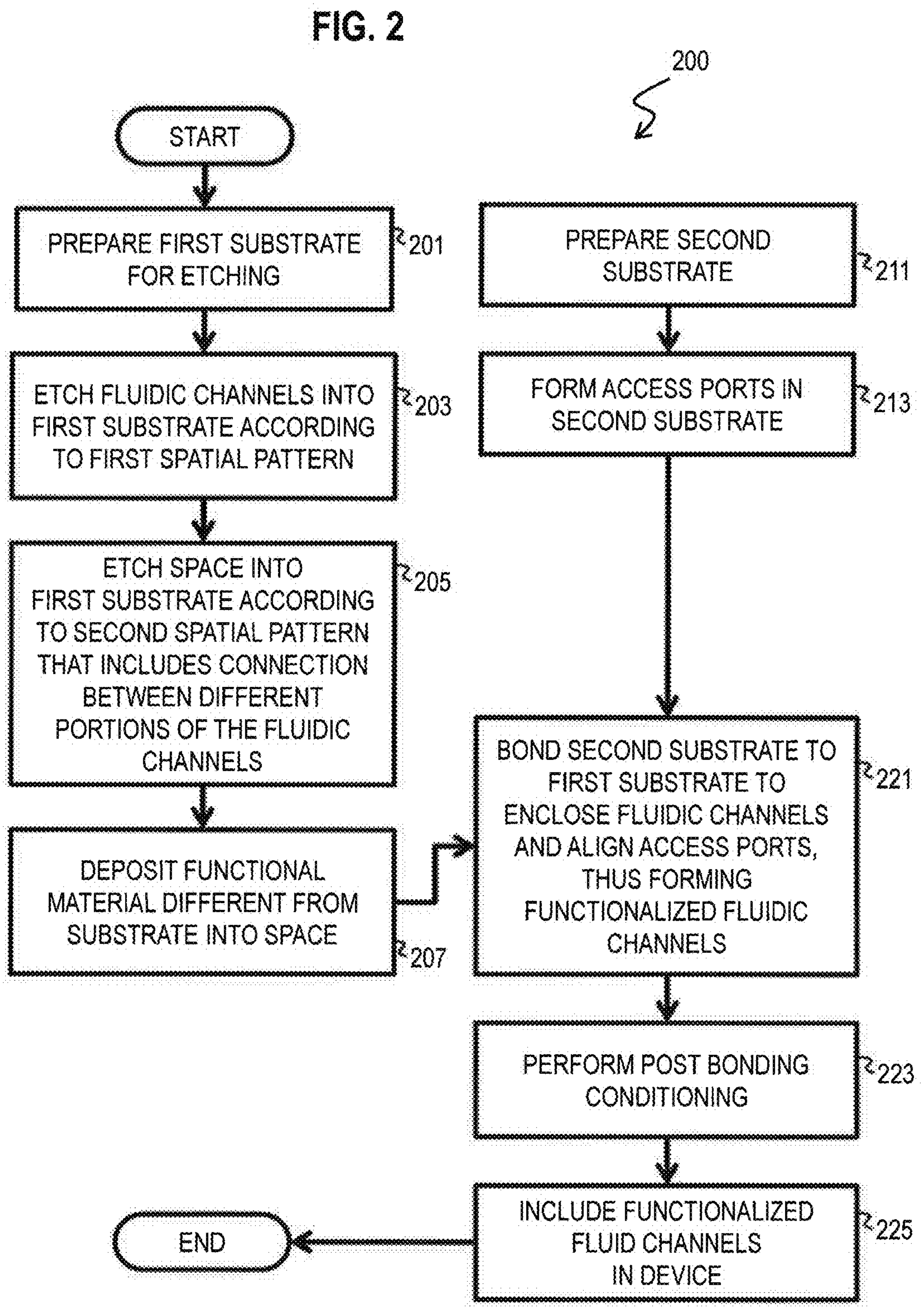
FIG. 2 is a flow chart that illustrates a non-limiting example of a method for fabricating functionalized fluidic channels, according to an embodiment.

FIG. 2 is a flow chart that illustrates a non-limiting example of a method 200 for fabricating functionalized fluidic channels, according to an embodiment. Although steps of method 200 (and in subsequent flow diagrams FIG. 3, FIG. 5, FIG. 6 and FIG. 7) are depicted as integral blocks in a particular order for purposes of illustration, in other embodiments, one or more steps, or portions thereof, may be performed in a different order or overlapping in time, in series or parallel, or are omitted, or additional steps are added, or the method is changed in some combination of ways.

In step 201, the first substrate is prepared for etching. As a non-limiting example, a wafer of the first material with a generally planar surface is cleaned to remove particulate matter on the surface of the substrate as well as any traces of organic, ionic, and metallic impurities.

In step 203, fluidic channels are etched into the first substrate according to a first spatial pattern. In some embodiments, the pattern is imposed using a computer controlled laser, sand jet or jet of liquid with abrasives. In some embodiments the pattern is imposed using a lithographic mask, a removable layer of photosensitive material that resists etching (a photoresist), and an etching plasma or etching liquid, such as acid, as described in more detail in FIG. 3 for a particular embodiment of step 203. Such lithographic techniques as described in FIG. 3 offer the advantage of simultaneous fabrication of multiple copies on a single wafer, compared to laser or abrasive jets.

In step 205, space for the functional material is etched into the first substrate according to a second spatial pattern. In some embodiments, the pattern is imposed using a computer controlled laser, sand jet or jet of liquid with abrasives. In some embodiments, the pattern is imposed using lithographic techniques, as described below with reference to FIG. 3. In some embodiments, spaces for several different functional materials are etched simultaneously during step 205, as a non-liming example by etching constant depths, but to different lengths or including different numbers of walls of the channels or some combination. In other embodiments, step 205, or steps 205 and 207, described next, are repeated for each different functional material included.

In step 207 one or more different functional materials are deposited into the spaces etched into the first substrate during step 205. In some embodiments, the material is imposed using a computer controlled jet or 3D printer. In some embodiments, the material is deposited using a lithographic mask, a removable layer of photosensitive material that promotes removal (a photoresist), and a blanket depositing process, such as sputtering, as described in more detail in FIG. 5 for a particular embodiment of step 207. Such lithographic techniques as described in FIG. 5 offer the advantage of simultaneous fabrication of multiple copies on a single wafer compared to computer controlled jets or printing. The functional material is deposited to a thickness such that when the first substrate is bonded to a second substrate, as described below, the second material deposited between the channels prevents noticeable fluid transfer between the channels in any gap between the second material and the level of the bonding surface 130. A gap that is small enough to cause a Reynolds number usually less than 1, but sometimes as high as 100, is dominated by viscous forces that prevent significant fluid movement. In some embodiments, the second material is deposited to a thickness that extends beyond the level of the bonding surface 130 and is ground away in a subsequent step before bonding, e.g., in a chemical-mechanical polishing step, to achieve a planar bonding surface.

In step 211 a second substrate of the same or different material from the first substrate material is prepared as a capping component. As a non-limiting example, a wafer of a second material with a generally planar surface is cleaned to remove particulate matter on the surface of the substrate as well as any traces of organic, ionic, and metallic impurities. In various embodiments, the substrate is fabricated from a glass or silicon type material, or from Pyrex glass. In some embodiments, step 211 includes forming channels or functional material or both on the second substrate as well, as described above for the first substrate, and illustrated in more detail below with reference to FIG. 9. In some embodiments, step 211 includes depositing a sealing material on the second substrate to ensure proper fluid flow isolation between channels connected by the functional material, as also depicted in FIG. 9, described below. The sealing material provides a different function than the functional material, and is soft enough to conform to irregularities in the bonding surface and close any fluid path between channels connected by the functional material.

In step 213 one or more access sports are formed in the second substrate. As a non-limiting example, through the use of photolithographic techniques, a mask is laid upon the substrate and a pattern defining port regions are exposed thereon whereby a selected portion of the layer is subsequently exposed to an etchant and washed away. In some embodiments, after the formation of an $O_2$ or $SiO_2$ layer, photoresist is applied to the surface of the second substrate. In non-limiting examples of embodiments, a pattern of port regions on the substrate are photo-lithographically defined; and, the substrate is etched in an acid. Thereafter, in some embodiments, measurements are performed via profilometry. As used herein, profilometry refers to the use of a technique for the measurement of the surface shape of an object, such as laser scanning, scanning electron microscopy, interferometer, pin-drop and Atomic Force Microscopy. Once the desired profile is etched, a high speed drilling process is performed to create input and output ports. Final measurements are taken and the capping, second component is cleaned and processed through a dehydration baking step.

In step 221, the capping component comprising the second substrate with any access ports is bonded to the bonding surface of the first component comprising the first substrate with any functionalized fluidic circuitry. During bonding, access ports are aligned with the channels and any chambers in the first component. Thus, during step 221, functionalized fluidic channels are formed. A particular bonding process, used in some embodiments, is described in more detail below with reference to FIG. 6.

In step 223, post-bonding conditioning is performed, such as further cleaning and testing for desired performance. A particular post-bonding conditioning process, used in some embodiments, is described in more detail below with reference to FIG. 7.

In step 225, the functionalized fluidic channels are incorporated into a device, such as device 180, like a JT cryocooler for an infrared detector.

Figure 3:
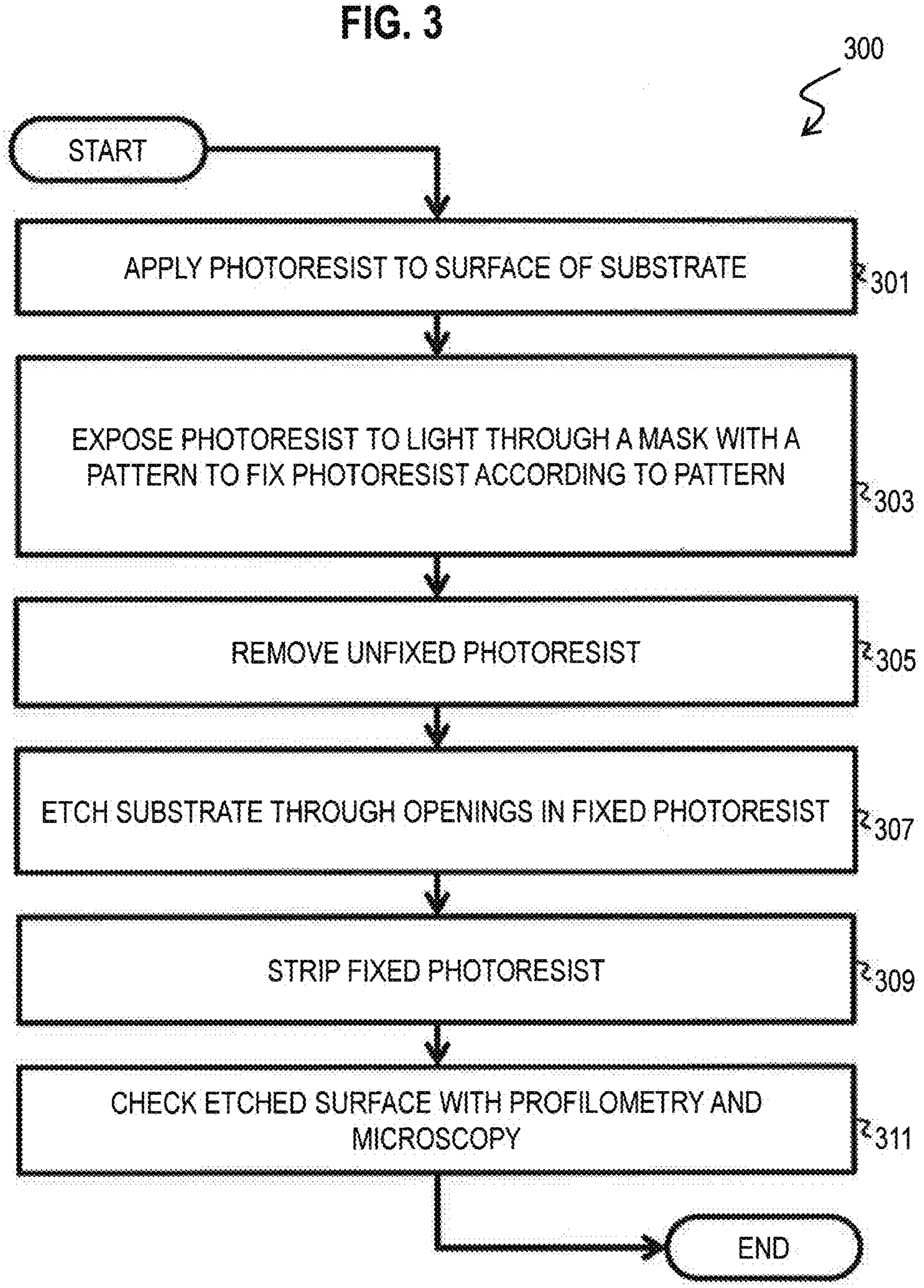
FIG. 3 is a flow chart that illustrates a non-limiting example of a method for performing an etching step of the method of FIG. 2, according to an embodiment.

FIG. 3 is a flow chart that illustrates a non-limiting example method 300 for performing an etching step of the method of FIG. 2, according to an embodiment. Thus method 300 is one embodiment for performing the steps 203 or 205 or both of the method 200 depicted in FIG. 2. The method 300 uses photolithographic techniques that provide advantages of scale compared to point etching, drilling or cutting techniques. A first pattern of channels along the substrate is photolithographically defined. In step 301, a photoresist material is deposited on the surface of the wafer for the first substrate. In step 303, the photoresist is exposed to light through a mask with a pattern to fix portions of the photoresist according to the pattern. In step 305, the photoresist that has not been fixed is removed by an appropriate developer to leave openings (windows) that reveal the substrate.

In step 307, the substrate is etched, e.g., using an acid solution, through the openings (windows) in the fixed substrate. As a non-limiting example, in various embodiments, the acid is hydrofluoric acid or phosphoric acid. In step 309, the fixed photoresist patterned by the photolithography is stripped away using a different solution or grinding process. Thereafter, the resulting surface is checked, optionally, in step 311, e.g., using profilometry.

As will be appreciated by those skilled in the art, there are two types of photoresists: positive and negative, either or both of which may be used in various embodiments. For positive resists, the resist is exposed with light (such as ultraviolet, UV, light) wherever the underlying resist is to be removed. In these resists, exposure to the light changes the chemical structure of the resist so that it becomes more soluble in the developer. The exposed resist is then washed away by a developer solution, leaving windows to the bare substrate material. The unexposed resist remains on the substrate. The mask, therefore, contains an exact copy of the pattern of resist which is to remain on the wafer. Negative resists behave in an opposite manner from positive resists. Exposure to light, such as UV light, causes the negative resist to become polymerized, and more difficult to dissolve. Therefore, the negative resist remains on the surface wherever it is exposed, and the developer solution removes only the unexposed portions. Masks used for negative photoresists, therefore, contain the inverse (or photographic "negative") of the pattern of resist to be transferred to the substrate. Negative resist is more resistant to acids for etching. Because negative resists typically harden by covalent bonding (polymeric crosslinking), negative resists form an almost reactively inert layer. Typically negative resists are epoxies, which gives them good mechanical durability and stable properties over extended times.

Figure 4A:
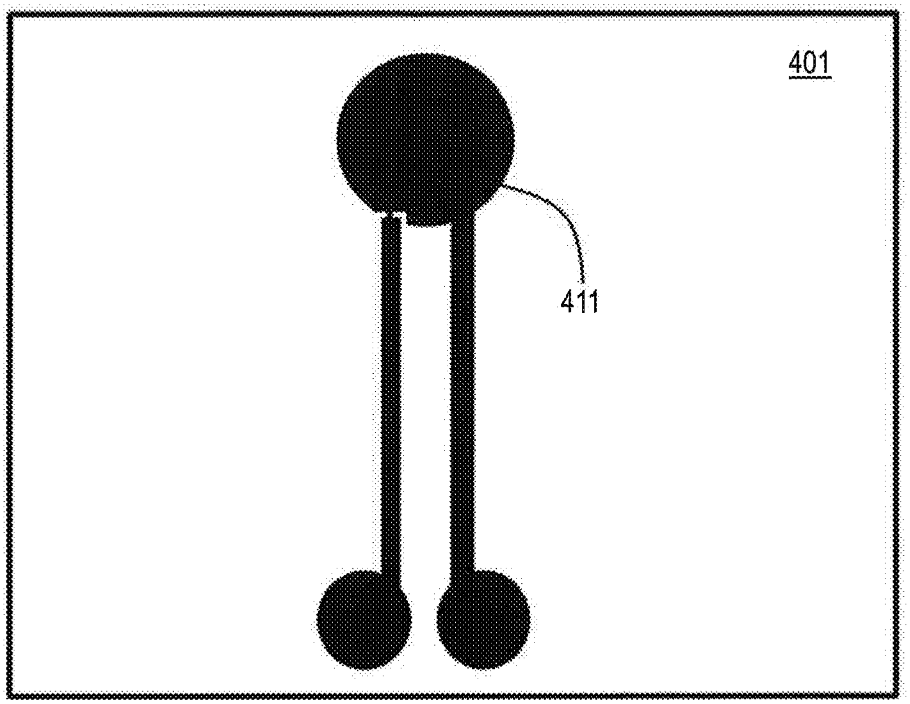
FIG. 4A and FIG. 4B are block diagrams that illustrate non-limiting examples of masks for a photolithographic step for etching the fluidic channels of FIG. 1A, according to various embodiments.
Figure 4B:
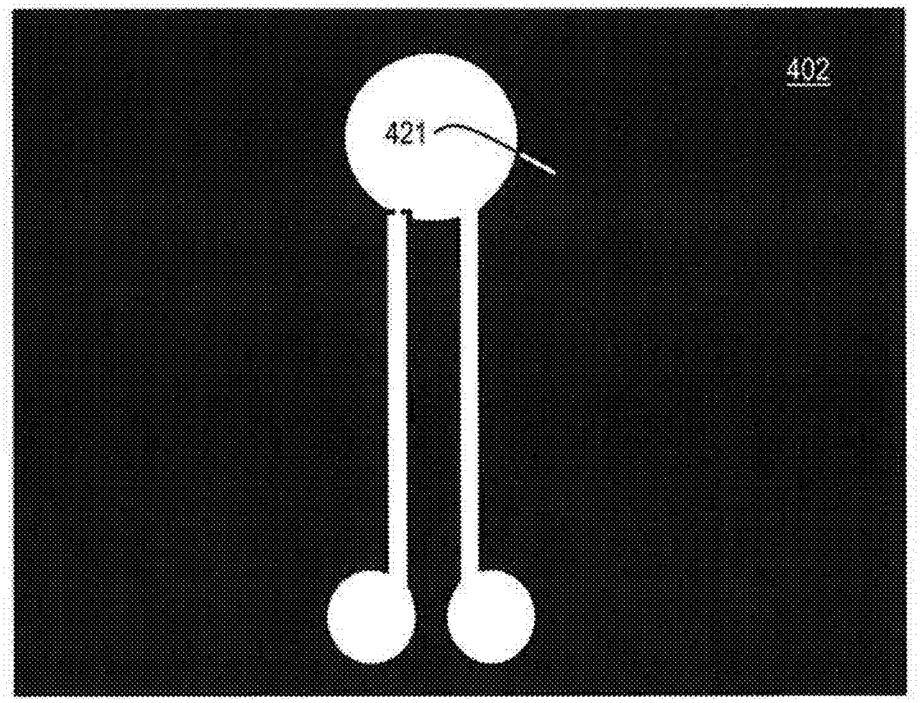

FIG. 4A and FIG. 4B are block diagrams that illustrate non-limiting examples of masks for a photolithographic step for etching the fluidic channels of FIG. 1A, according to various embodiments. As a non-limiting example, a mask 401 for a negative resist for the channels and chambers of FIG. 1 is depicted in FIG. 4A. In FIG. 4A, the dark areas 411 indicate where light is blocked and the resist is not polymerized, but will wash away in the developer. These areas become windows to the substrate and allow an etching solution to remove the substrate. Thus the channels and chambers of FIG. 1 are formed in the substrate. Correspondingly, a mask 402 for a positive resist for the channels and chambers of FIG. 1 is depicted in FIG. 4B. In FIG. 4B, the dark areas 421 indicate where light is blocked and the resist will not wash away in the developer. The complementary white areas indicate where the light passes through to the resist and render it soluble in the developer. These white areas become windows to the substrate and allow an etching solution to remove the substrate. Thus, in some embodiments, the channels and chambers of FIG. 1 are formed in the substrate using one of the masks 401 or 402 in method 300 to perform step 203.

Figure 4C:
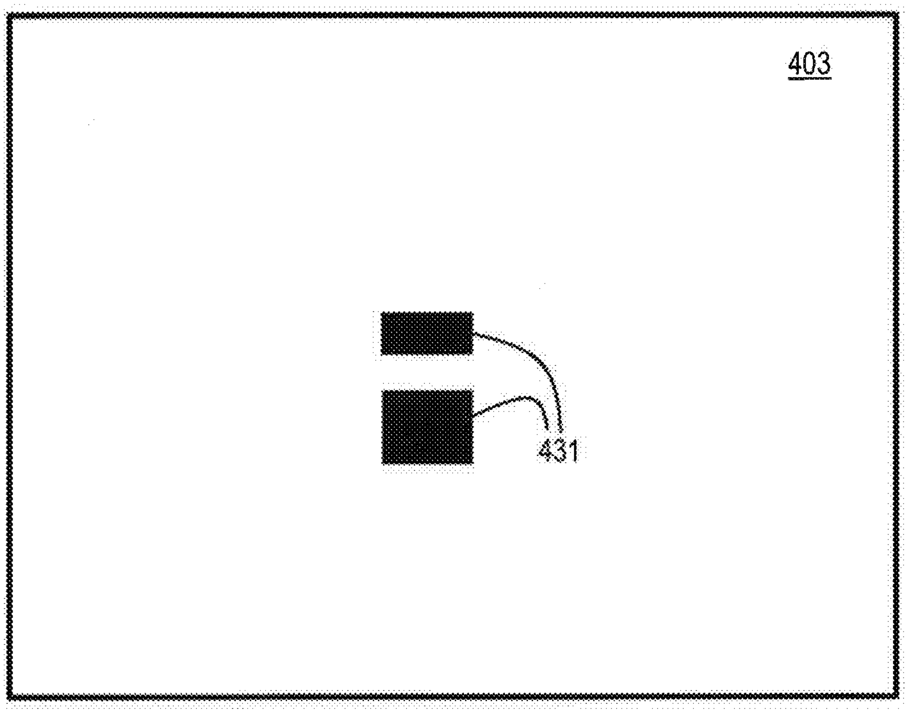
FIG. 4C and FIG. 4D are block diagrams that illustrate non-limiting examples of masks for a photolithographic step for etching space for the functional material of FIG. 1A, according to various embodiments.
Figure 4D:
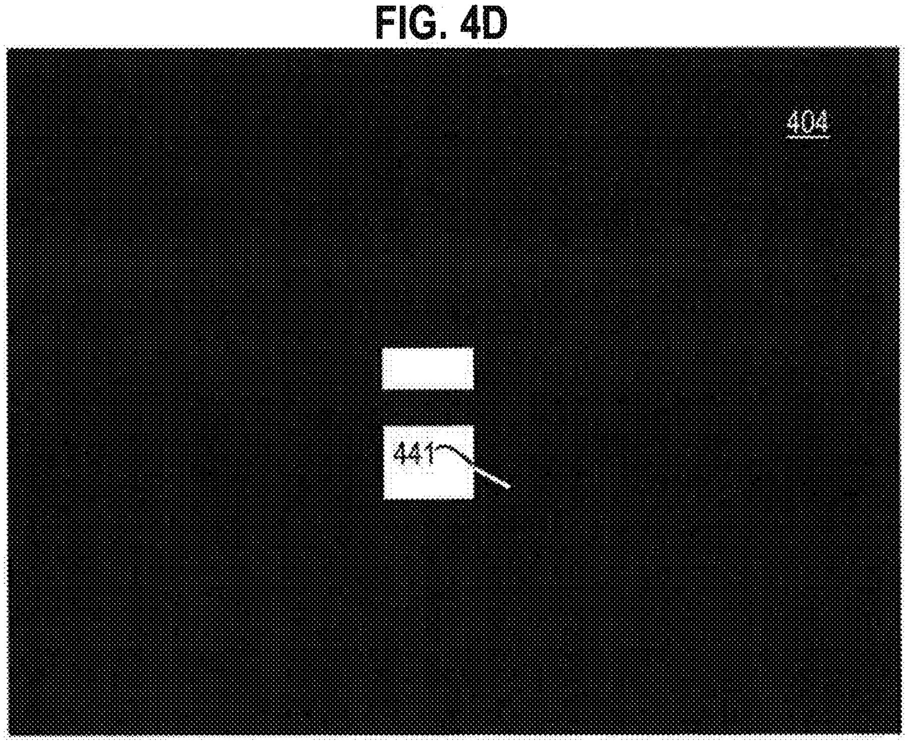

FIG. 4C and FIG. 4D are block diagrams that illustrate non-limiting examples of masks for a photolithographic step for etching space for the functional material of FIG. 1A, according to various embodiments. As a non-limiting example, a mask 403 for a negative resist for the functional material of FIG. 1 is depicted in FIG. 4C. In FIG. 4C, the dark areas 431 indicate where light is blocked and the resist is not polymerized, but will wash away in the developer. These areas become windows to the substrate and allow an etching solution to remove the substrate material. Thus the spaces for the functional material of FIG. 1 are formed in the substrate. Correspondingly, a mask 404 for a positive resist for the functional material of FIG. 1 is depicted in FIG. 4D. In FIG. 4D, the dark areas 441 indicate where light is blocked and the resist will not wash away in the developer. The complementary white areas indicate where the light passes through to the resist and render it soluble in the developer. These white areas become windows to the substrate and allow an etching solution to remove the substrate. Thus, in some embodiments, the spaces for the functional material of FIG. 1 are formed in the substrate using one of the masks 403 or 404 in method 300 to perform the second etching in step 205 of method 200 in FIG. 2.

Figure 5:
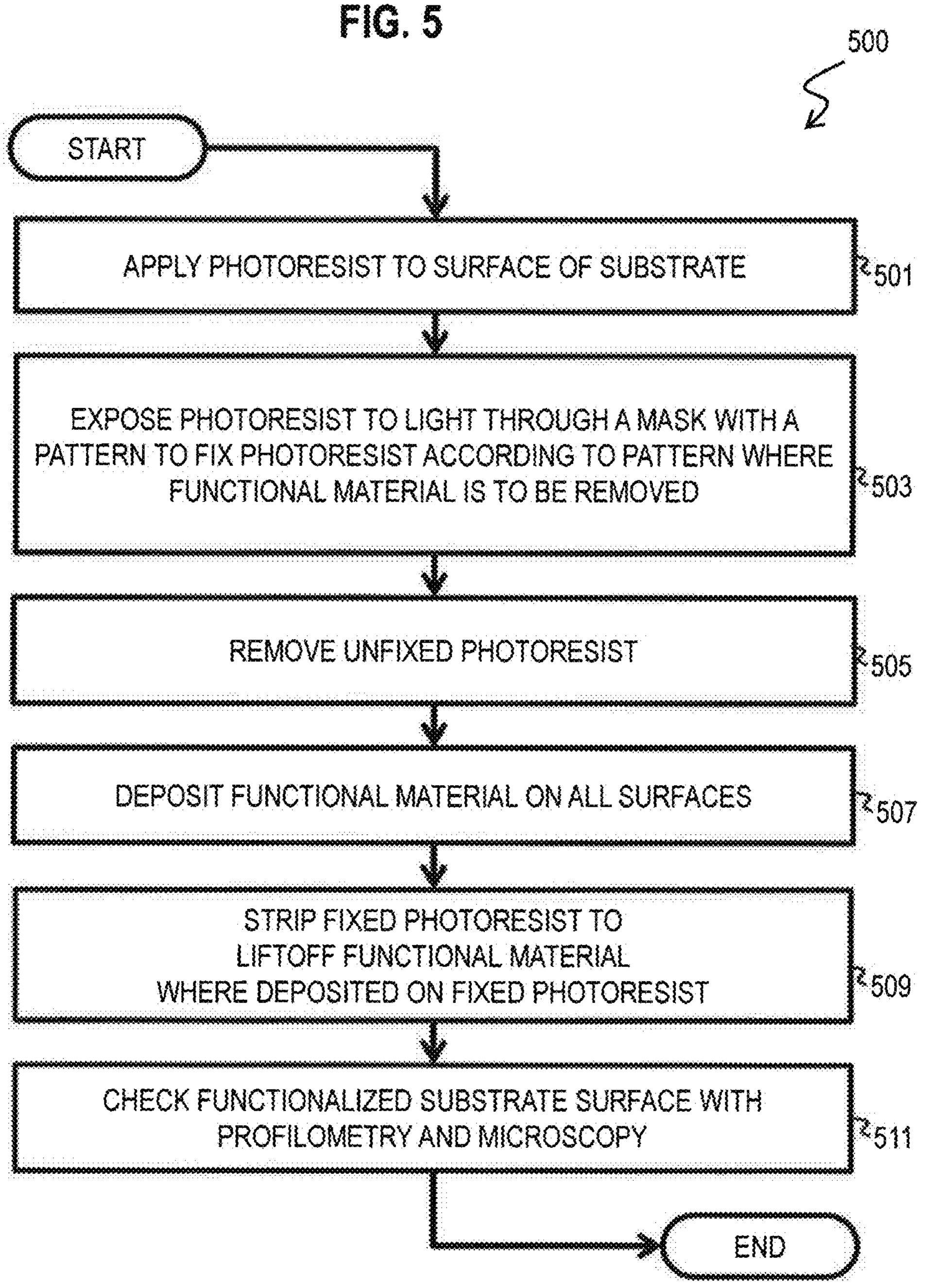
FIG. 5 is a flow chart that illustrates a non-limiting example of a method for performing a deposition step of the method of FIG. 2, according to an embodiment.

FIG. 5 is a flow chart that illustrates a non-limiting example of a method for performing a deposition step of the method of FIG. 2, according to an embodiment. Thus method 500 is one embodiment for performing step 207 of the method 200 depicted in FIG. 2. The method 500 uses photolithographic techniques that provide advantages of scale compared to point deposition and printing head embodiments.

Once the desired space is etched and measured, a liftoff pattern is photo-lithographically defined upon the substrate, similar to the pattern that etched space for the functional material. In step 501 the photoresist that will define the lift off pattern is applied to the substrate. In step 503 the photoresist is exposed to light through a mask with a pattern to fix the photoresist according to the pattern where the functional material is to be lifted off. In various embodiments, the liftoff pattern is similar to the pattern that formed the space, as depicted in FIG. 4C for negative resist or 4D for positive resist, but can be somewhat different if the etching proceeds under the original mask, and the final deposit area is somewhat larger than the window used to etch the space, as shown below with reference to FIG. 8. In some embodiments, a different functional material is to be deposited in different spaces (e.g., functional material 120*a* is different from functional material 120*b*), and the liftoff pattern has a window corresponding to only one of those two spaces etched. In step 505 the unfixed photoresist is removed to leave windows where the functional material is to remain deposited on the substrate.

In step 507 a functional material, such as a thermally conductive counter-flow heat exchanger (CFHX) material or film, is deposited. As a non-limiting example, CFHX materials, e.g., for JT microcooler applications made with SiO substrates, may include polysilicon or titanium/nickel, any metals that do not react with the gas, conductive ceramics like silicon nitride, and diamond, among others, alone or in some combination. In other embodiments, the functional material is one or more of metals Ni, Cr, Ti, Au, Al, Ag, In, Sn, W, ITO, and others which can be deposited using thin film methods; and, serve as thermal and electrical conductors. Miscellaneous materials such as SiN, SiO, Si, Si(poly), Ge, Si(doped p or n) can serve as semiconductors and optical absorbers or emitters. The functional material contacts the substrate only in the windows of the pattern; and, lies above the photoresist everywhere else. In step 509, the fixed photoresist is stripped off, thus lifting off the functional material where it was deposited on the fixed photoresist, and leaving the functional material only in the windows of the pattern.

It is advantageous that the upper surface of the functional material forms a highly planar surface so that capping the first substrate forms fluid channels with little or no leakage. In some embodiments, the pattern match is perfect with no gas leakage paths. In some embodiments, functional material overlaps above the surface and is polished back to planarity. In some embodiments, the functional material overlaps above the surface and a layer of bonding adhesive (like glass frit) accommodates the surface topology. In some embodiments, the functional material overlaps above the surface and is polished back to planarity; and, then a layer of bonding adhesive accommodates minor fluctuations in the surface topology. Optionally, additional profilometry measurements are taken in step 511 to ensure sufficient planarity and negligible leakage.

Figure 6:
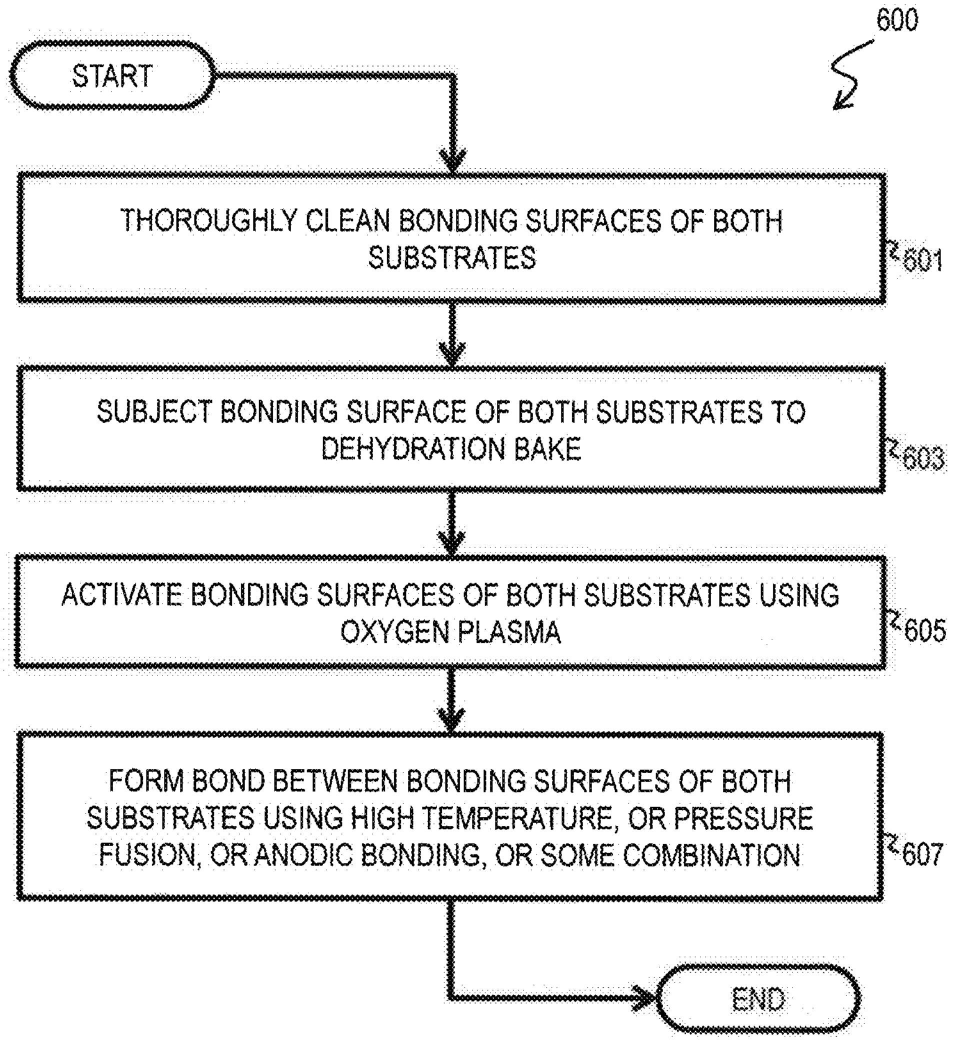
FIG. 6 is a flow chart that illustrates a non-limiting example of a method for performing a bonding step of the method of FIG. 2, according to an embodiment.

FIG. 6 is a flow chart that illustrates a non-limiting example of a method 600 for performing a bonding step of the method of FIG. 2, according to an embodiment. Thus method 600 is one embodiment for performing step 221 of the method 200 depicted in FIG. 2. In step 601 the wafers for one or both substrates are cleaned and generally prepared for bonding to each other. As a non-limiting example, in some embodiments, any second material that extends beyond the level of the bonding surface 130 of the first substrate is ground away. Optionally, in step 603, the bonding surfaces, at least one or both wafers are subjected to a dehydration bake to remove excess liquids from any of the previous processes. Optionally, in step 605, a final oxygen plasma surface activation is performed. One skilled in the art will appreciate that the phrase oxygen plasma surface activation generally means a method of functionalizing the surface of the substrate by means of plasma processing. It is done with the intent to alter or improve adhesion properties of surface prior to coating or bonding. In some embodiments, weakly ionized low energy oxygen plasma is used to functionalize surfaces which may not have immediately desirable surface chemistry for bonding, such as in the elevated regions of the CFHX material areas.

In step 607, the bonding surfaces of both substrates are bonded using any appropriate techniques, alone or in some combination. As a non-limiting example, wafers may be bonded together using high temperature pressure fusion, high-voltage anodic bonding, controlled adhesives and glass frit, moderate or high-temperature fusion techniques, and further reinforced under the influence of a high-strength electric field, depending on the material of the substrate or functional material. In some embodiments, materials that can create particulate contamination in the channel can cause failure of the device for its particular purpose; and, are to be avoided as the functional material in such devices.

Figure 7:
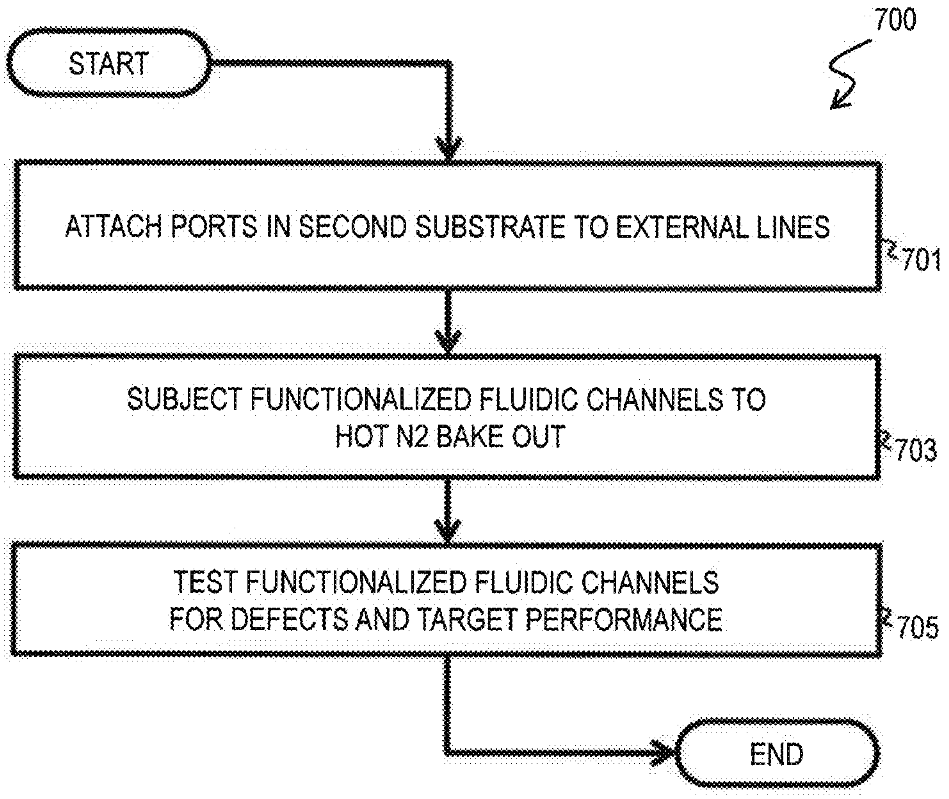
FIG. 7 is a flow chart that illustrates a non-limiting example of a method for performing a post-bonding step of the method of FIG. 2, according to an embodiment.

FIG. 7 is a flow chart that illustrates a non-limiting example of a method for performing a post-bonding step of the method of FIG. 2, according to an embodiment. Thus method 700 is one embodiment for performing step 223 of the method 200 depicted in FIG. 2. In step 701, access ports in the second, capping substrate (e.g., substrate 160) are attached to external components. As a non-limiting example, input and output ports are attached to a JT heat exchanger or cryostat. A hot nitrogen bake is then performed in step 703 to eliminate potential contaminants trapped in the functionalized fluidic channels and bond line. In step 705, the functionalized fluidic channels are then inspected for correct bonding and tested for the particular use.

FIG. 8A through FIG. 8L are block diagrams that illustrate a non-limiting example of a series of results on a first substrate of the method of FIG. 2, FIG. 3 and FIG. 5, according to an embodiment. For purposes of illustration, the embodiment is assumed to be formation of a JT cryocooler. By fabricating a JT cryocooler using the above described method, in a particular embodiment, only two wafers are required. Further, a simple, repeatable, and scalable process is provided which allows precision in manufacture of JT cryocoolers.

Figures 8A, 8B, 8C, 8D, 8E, 8F, 8G, 8H, 8I, 8J, 8K, 8L:
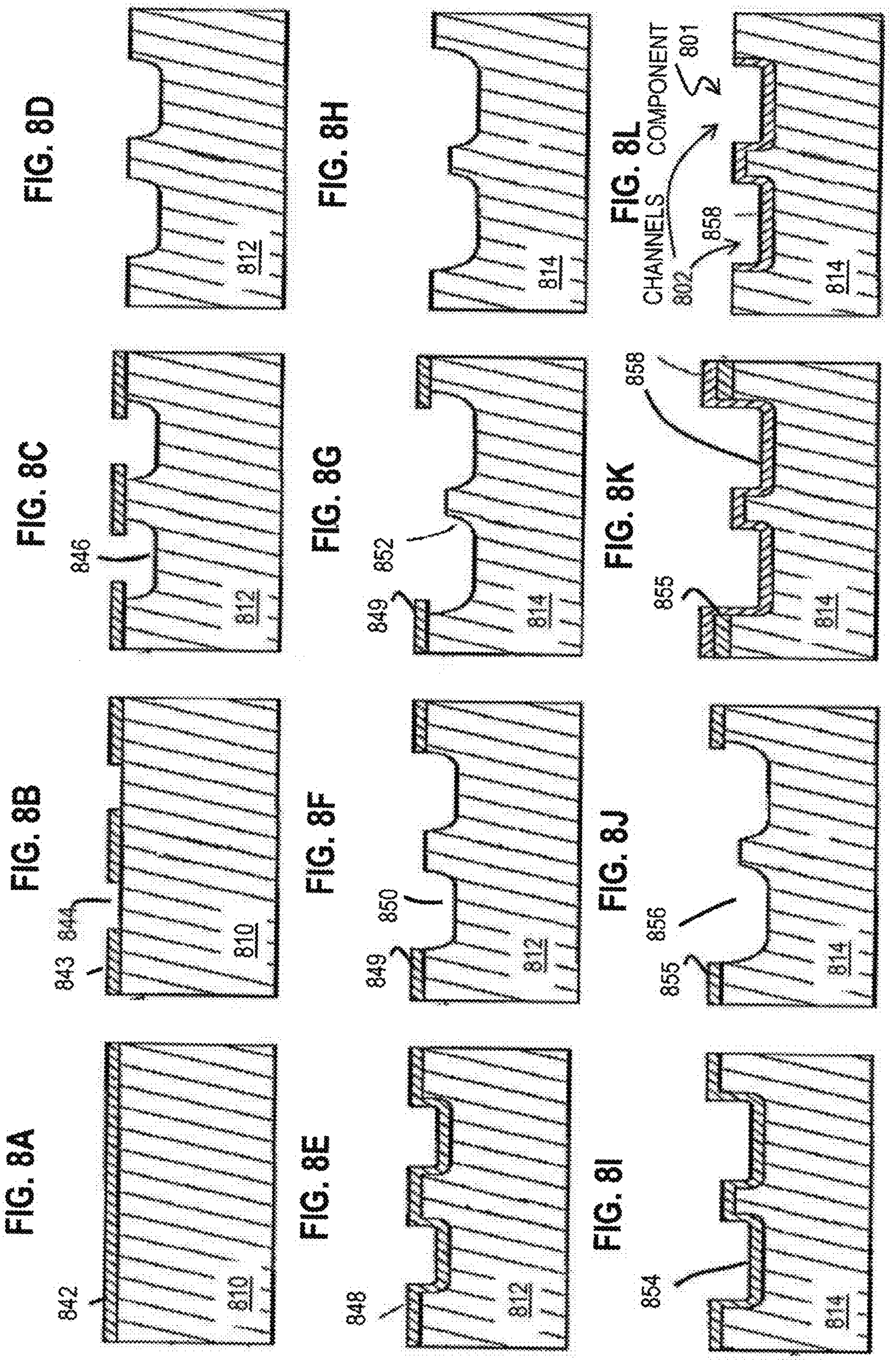
FIG. 8A through FIG. 8L are block diagrams that illustrate a non-limiting example of a series of results on a first substrate of the method of FIG. 2, FIG. 3 and FIG. 5, according to an embodiment.

As shown in FIG. 8A, a substrate wafer 810 is provided and, after cleaning, a photoresist 542 is deposited thereon. In FIG. 8B, a first pattern with windows 844 defining a plurality of channels constituting the fluidic circuit is formed in the fixed photoresist 843 by photolithographic exposure to UV light and rinsing with a developer. Thereafter, as shown in FIG. 8C, portions of the substrate material are selectively etched away by exposure to an acid, to which the photoresist is resistant, leaving a newly shaped etched substrate 812. Note that substrate material under the edges of the fixed photoresist 843 has also been etched away, increasing the width of the channels 846 compared to the photoresist pattern based on the mask. As shown in FIG. 8D, the substrate 812 with channels 848 is cleaned of extraneous etch mask photoresist material 843.

As shown in FIG. 8E, a second photoresist material 518 is deposited on the substrate 812 to photolithographically define a plurality of CFHX regions constituting the thermal circuit or thermal function. As shown in FIG. 8F, a second pattern with window 850 defining a space for deposition of the functional material is formed in the fixed photoresist 849 by photolithographic exposure to UV light and rinsing with a developer. As shown in FIG. 8G, the substrate material is further etched by exposure to acid, in order to expand the space 852 for the functional CFHX material, leaving a twice etched substrate 814. The fixed photoresist is resistant to the acid used. Again note that substrate material under the edges of the fixed photoresist 849 has also been etched away, increasing the width of the space 852 compared to the photoresist pattern based on the mask. As shown in FIG. 8H, the substrate 814 is cleared of extraneous fixed photoresist material 849.

As shown in FIG. 8I, a third photoresist 854 is applied to the substrate 814 for lithographically defining a lift off area after a functional material has been deposited. As shown in FIG. 8J, a third pattern with window 856 defining a space for permanent deposition of the functional material is formed in fixed photoresist 855 by photolithographic exposure to UV light and rinsing with a developer. As shown in FIG. 8K, a CFHX material film 858 is deposited upon the substrate 814 and fixed photoresist 855 using any know deposition techniques, such as evaporative deposition, physical vapor deposition, chemical vapor deposition, additive methods such as 3d printing and selective deposition, screen printing, and lithographic methods. As shown in FIG. 8L, the CFHX film 528 overlying the fixed photoresist 855 has been lifted off by a solution that removes the fixed photoresist 855 to form a first component 801 with CFHX material 858 lining and connecting portions of channels 802.

In non-limiting examples of embodiments, a manufacturing process template is provided which reduces the design of a planar, JT cryocoolers to only two wafers. In general, both wafers are advantageously made of thermally insulating material. One of the two wafers contains integrated thermal material and fluidic circuits coplanar to one another and with respect to the substrate plane. The other wafer is optically transparent and serves as an access substrate, or "capping wafer," which closes fluidic channels defined on the circuit wafer and bears holes for inlets/outlets. Any node in the thermal connections or fluidic circuits can be accessed by tapping the capping wafer, allowing connection with input/output lines for characterization probes. In non-limiting examples of embodiments, the wafer of the first substrate is typically fabricated from glass, quartz, or other silicon-based materials, but other materials may be used as long as they are thermally insulating. If the wafer for the first substrate is selected to be transparent like its capping wafer counterpart, the JT cryostat will have the advantage of being completely optically transparent. In still other non-limiting examples of embodiments, the substrate is composed of Pyrex glass. Significant production advantages are provided by a fabrication process wherein a thermally functionalized fluidic circuit wafer is manufactured in two stages of wet chemical etching, thin film deposition, and photolithographic liftoff processing. Subsequent to the manufacture of each wafer, the two wafers are bonded using thermal fusion or anodic techniques depending on the material selection of the substrates and thermal material and the various methods described above to ensure negligible leakage from the fluid channels.

In non-limiting examples of embodiments, a fabrication process is provided for rapid prototyping of a device built with ion-bearing glass substrates. The fabrication process includes the steps of fabricating a thermofluidic circuit wafer, then the steps of fabricating a capping wafer, and then bonding the thermofluidic circuit wafer and the capping wafer to one another. More specifically, in non-limiting examples of embodiments, the thermofluidic circuit wafer is fabricated by a two stage wet chemical etch process followed by an evaporative deposition step and related low-resolution photolithographic liftoffprocessing. The process begins with the provision of a generally planar, thermally insulating glass substrate that is cleaned to remove particulate matter or traces of organic, ionic, and metallic impurities on the working surface. After cleaning, an "etch-mask" layer such as negative photoresist is fabricated on the surface of the wafer substrate. Through the use of photolithographic techniques, a pattern which defines where fluidic channels are to be fabricated in the underlying glass substrate is defined on the etch-mask layer, which exposes the substrate in those regions. The substrate is selectively etched in an acid (e.g., concentrated hydrofluoric acid) to form the fluidic circuit channels. Thereafter, measurements are performed by profilometry to verify desired geometry; and, the remainder of the hard-mask is selectively etched away. Fluidic channels with depths and widths each in a range from about 100 nm to about 1 millimeter (mm, 1 mm=$10^{-3}$ meters), spaces 20 nm or more apart, are readily formed for a large number of copies.

A second etch mask is fabricated photo-lithographically corresponding to counter-flow heat exchanger (CFHX) regions constituting the thermal functionalization in the same manner as for the fluidic circuit. The substrate is again etched in an acid, measurements are performed a second time by profilometry, and the etch mask is stripped from the substrate leaving the CFHX regions at an elevation slightly lower than that of the substrate plane. Once the desired profile is achieved, a CFHX liftoff pattern is photo-lithographically defined directly upon the substrate and thermally-conductive CFHX material is deposited and lifted off regions where it is not desired. Again, one or more methods to ensure planarity and negligible leakage, as described above, are employed as desired. Final measurements are taken to ensure that the relative elevation of all surfaces destined for bonding are nearly in plane with one another. CFHX films of thickness 50 microns and separations of 10 microns are readily deposited in desired patterns. For metal functional materials, even thinner layers of 5 to 10 micron thickness and 1 micron separation are readily deposited in a desired pattern. Glass to glass bonding should be sufficiently flat so that little side gaps do not lead to failure under a pressure change of about 600 psi. In various embodiments, the surfaces are polished or a filling adhesive is added, or both. Optionally, a final oxygen plasma surface activation is performed to ease future bonding processes.

In non-limiting example of embodiments, the capping wafer is provided for bonding to the thermofluidic circuit wafer. A thermally insulating, optically transparent wafer such as glass is provided. The wafer is cleaned and holes are drilled where access to thermally functionalized fluidic circuitry is desired. The wafer can also be oxygen plasma surface activated to ease future bonding processes. Advantageously, this fabrication process allows for the potential production of optically transparent, JT microcoolers, enabling a variety of system configurations for devices used to cool focal plane arrays (FPA) and other photo-sensitive sensors or detectors.

In some embodiments, channels or functional material or both are disposed on the second substrate as well, before bonding, as described in more detail below for embodiments of a Joule-Thomson cryocoolers with reference to FIG. 9.

Figure 9A:
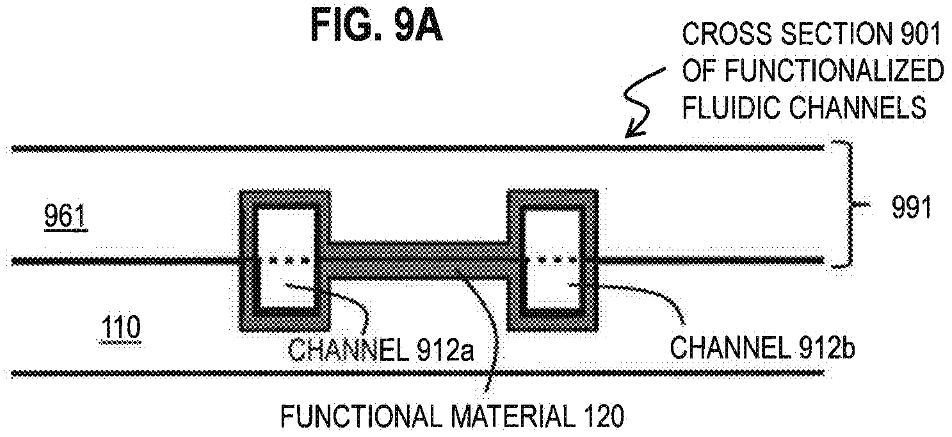
FIG. 9A through FIG. 9D are block diagrams that illustrate a non-limiting example of cross sections of functionalized fluidic channels, according to other embodiments.

FIG. 9A through FIG. 9D are block diagrams that illustrate a non-limiting example of cross sections of functionalized fluidic channels, according to other embodiments. FIG. 9A is a block diagram that illustrates a non-limiting example of cross section 901 of functionalized fluidic channels according to one embodiment. FIG. 9A shows that a substrate 961 of a capping wafer component 991 has been etched with channels that align with the channels in the substrate 110 to form heightened channels 912*a* and 912*b*. The capping wafer component 992 has also had functional material 120 deposited thereon to coat the portions of channels 912*a* and 912*b* on all sides. The bonding level shown by dashed lines passes through the heightened channels 912*a* and 912*b*. In many embodiments, the pattern, such as a lithographic mask, for the channels in the capping wafer substrate 961 is the mirror image of the pattern for the channels in the substrate 110, both for the channels and for the space where functional material 120 is to be deposited. Thus, before bonding the capping wafer, one or more fluidic channels are etched into the capping substrate (e.g., substrate 961) according to a complementary spatial pattern that causes the one or more fluidic channels in the capping substrate (e.g., substrate 961) to align with the one or more fluidic channels in the first substrate to form heightened channels (e.g., 912*a* and 912*b*). In other embodiments, only some of the channels are etched into the capping substrate so only some of the channels are heightened channels.

Figure 9B:
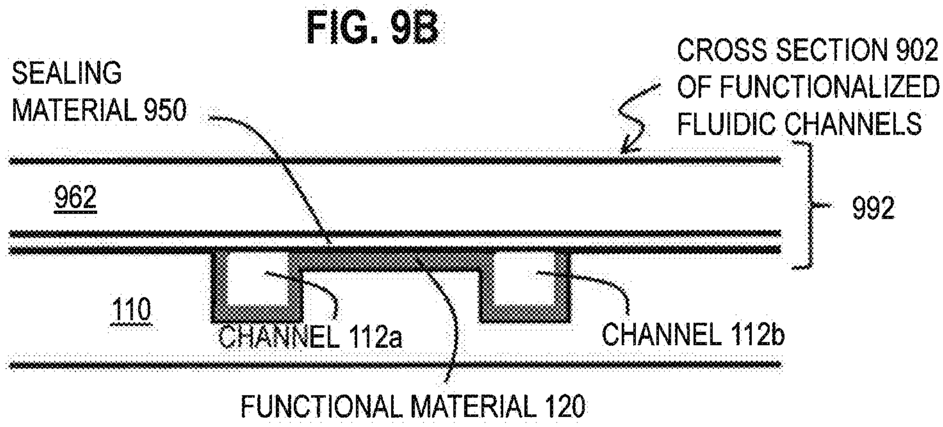

FIG. 9B is a block diagram that illustrates a non-limiting example of a cross section 902 of functionalized fluidic channels according to another embodiment. FIG. 9B shows that a substrate 962 of a capping wafer component 992 has a layer of sealing material 950 on the bonding surface. In some embodiments, the sealing material 950 is applied to the substrate 110 in addition to or instead of applying the sealing material 950 to the capping substrate 962. Thus, before bonding the capping substrate, a sealing material 961 is deposited on one or both of the first substrate 110 and capping substrate 961. As stated above, the sealing material provides a different function than the functional material, and is soft enough to conform to irregularities in the bonding surface and close any fluid path between channels connected by the functional material.

Figure 9C:
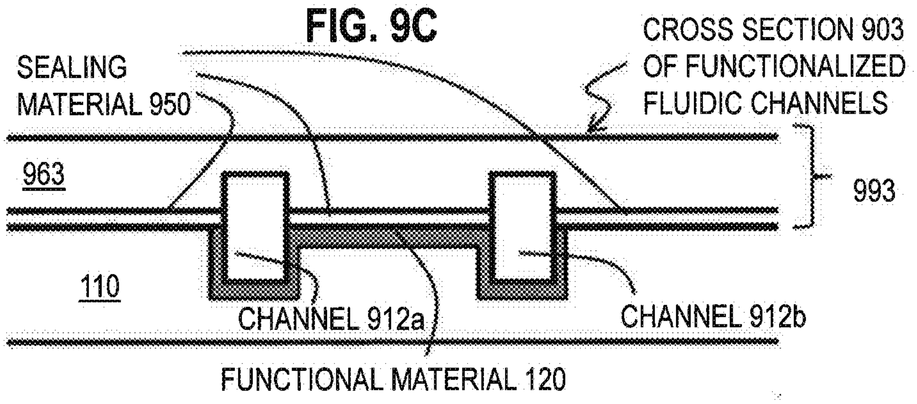

FIG. 9C is a block diagram that illustrates a non-limiting example of a cross section 903 of functionalized fluidic channels according to yet another embodiment. FIG. 9C shows that a substrate 963 of a capping wafer component 993 has been etched with channels that align with the channels in the substrate 110 to form heightened channels 912*a* and 912*b*. The bonding level passes through the heightened channels 912*a* and 912*b*. In many embodiments, the pattern, such as a lithographic mask, for the channels in the capping wafer substrate 963 is the mirror image of the pattern for the channels in the substrate 110. Thus, before bonding the capping wafer, one or more fluidic channels are etched into the capping substrate (e.g., substrate 963) according to a complementary spatial pattern that causes the one or more fluidic channels in the capping substrate (e.g., substrate 963) to align with the one or more fluidic channels in the first substrate (e.g., substrate 110) to form heightened channels (e.g., 912*a* and 912*b*). In other embodiments, only some of the channels are etched into the capping substrate so only some of the channels are heightened channels. Substrate 963 of the capping wafer component 993 also has a layer of sealing material 950 on the bonding surface. In some embodiments, the sealing material 950 is applied to the substrate 110 in addition to or instead of applying the sealing material 950 to the capping substrate 963. Note that in this embodiment, the channels etched in the capping substrate do not include, and are thus not connected by, a functional material.

Figure 9D:
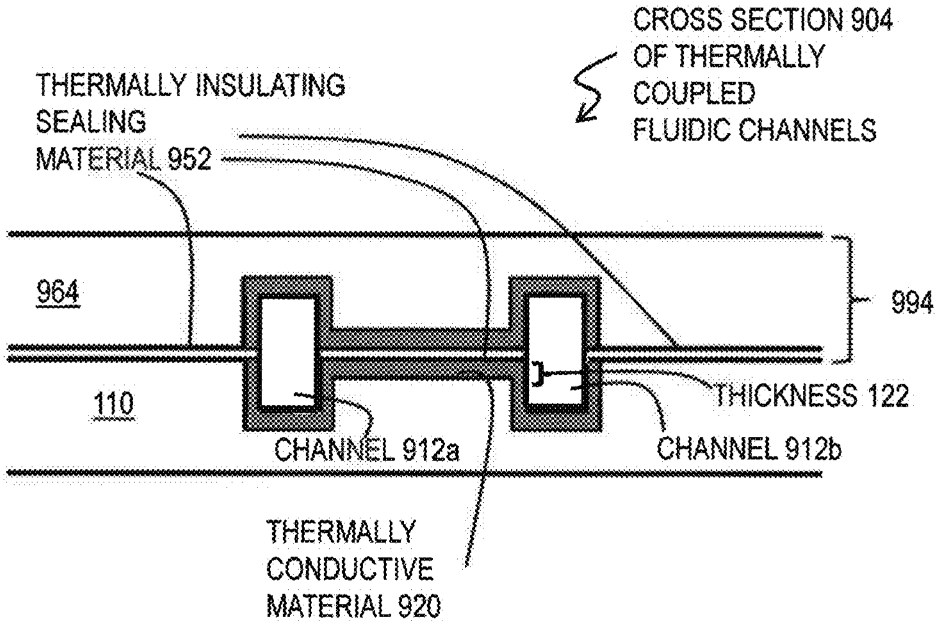

FIG. 9D is a block diagram that illustrates a non-limiting example of a cross section 904 of functionalized fluidic channels according to another embodiment. FIG. 9D shows that a substrate 964 of a capping wafer component 994 has been etched with channels that align with the channels in the substrate 110 to form heightened channels 912*a* and 912*b*. For purposes of illustration it is assumed that the functional material is thermally conductive material 920 compared to the material of substrates 110 and 964, as is useful in Joule-Thomson cryocooler embodiments described in more detail below. The capping wafer component 994 has also had thermally conductive material 920 deposited thereon to coat the portions of channels 912*a* and 912*b* on all sides. The bonding level passes through the heightened channels 912*a* and 912*b*. In many embodiments, the pattern, such as a lithographic mask, for the channels in the capping wafer substrate 961 is the mirror image of the pattern for the channels in the substrate 110, both for the channels and for the space where thermally conductive material 920 is to be deposited. In other embodiments, only some of the channels are etched into the capping substrate so only some of the channels are heightened channels. Substrate 964 of the capping wafer component 994 also has a layer of sealing material, such as thermally insulating sealing material 952 compared to the thermal conductivity of material 920, on the bonding surface. In some embodiments, the sealing material 952 is applied to the substrate 110 in addition to or instead of applying the sealing material 952 to the capping substrate 964. In either case, a layer of sealing material 952 less conductive than the material 920 divides the thermally conductive material 920. This sealing material ensures that fluid does not flow through any gap along the bonding surface between connected channels 912*a* and 912*b*. As a non-limiting example, in some Joule-Thomson cryocoolers, the thermally conductive material 920 is a polysilicon or a titanium/nickel alloy, while the thermally insulating sealing material 952 is gold, a malleable metal suitable for closing gaps. While gold has good thermal conduction for many applications, the thermal conductivity of gold is much lower than the thermal conductivity of polysilicon or of titanium/nickel alloys.

Figure 10:
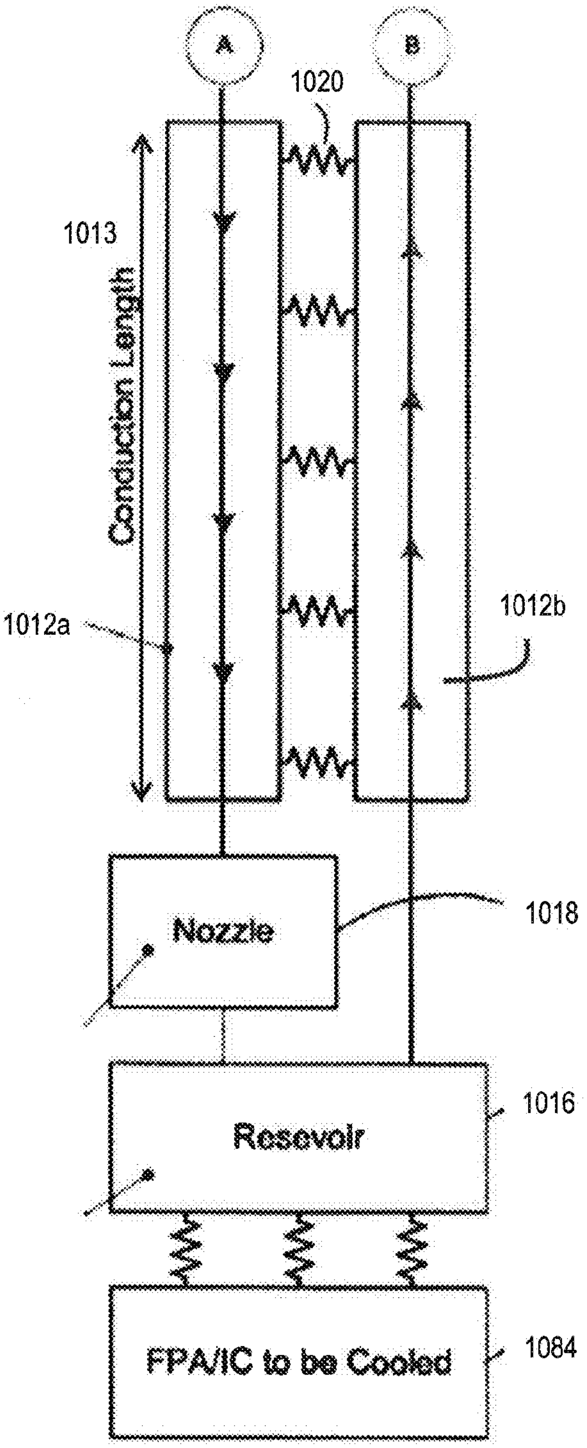
FIG. 10 is a block diagram that illustrates non-limiting examples of fluidic and thermal circuits that introduce a region of counter-flow heat exchange (CFHX) in a Joule-Thomson cryocooler, according to an embodiment.

FIG. 10 is a block diagram that illustrates non-limiting examples of fluidic and thermal circuits that introduce a region of counter-flow heat exchange (CFHX) in a Joule-Thomson cryocooler, according to an embodiment. The non-ideal gas under pressure flows from a source A through a channel 1012*a* to a nozzle 1018 into an expansion chamber called reservoir 1016. The exhaust low pressure gas flows through channel 1012*b* to an exhaust port B. This describes the fluid flow in the direction of the arrowheads.

The thermal circuit includes thermal conduction elements 1020 that thermally link the fluid in channel 1012*a* to the fluid in 1012*b*. This exchange not only preconditions the pressured non-ideal gas in channel 1012*a*, but also relieves thermal stresses in a substrate caused by larger temperature difference between fluids in the two channels. Thermal conduction affecting the non-ideal gas under pressure, and the efficiency of the cryocooler, also occurs along the length of the supply channels 1012*a* indicated by conduction length 1013. While good conduction through conduction elements 1020 is desirable, thermal conduction along conduction length 1013 is undesirable. Such conduction along length 1013 is reduced by avoiding contact with a conducting element along the full length 1013, e.g., by breaks in the thermally conductive material along the channel 1012*a*. The cooling provided by the adiabatic expansion of non-ideal gas at nozzle 1018 into reservoir 1016 is harvested by thermal conducting elements between at least a portion of the reservoir 1016 and the object to be cooled 1084, such as a focal plane array (FPA) and integrated circuit (IC).

Figure 11:
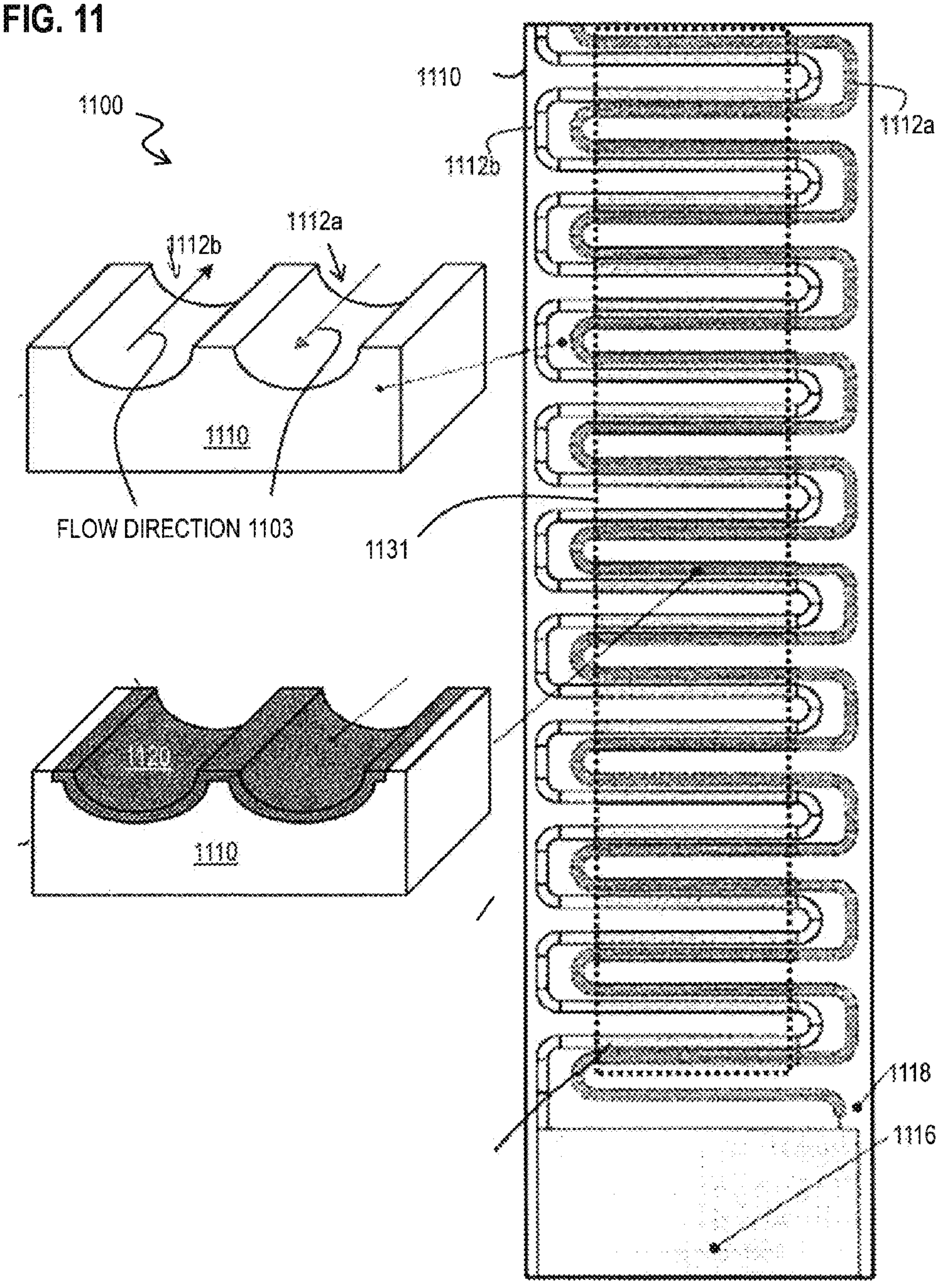
FIG. 11 is a block diagram that illustrates a non-limiting example of a layout of microchannels for fluidic circuits and thermal conductors for thermal circuits on a substrate to implement counter-flow heat exchange (CFHX) in a Joule-Thomson cryocooler, according to an embodiment.

FIG. 11 is a block diagram that illustrates a non-limiting example of a layout of microchannels for fluidic circuits and thermal conductors for thermal circuits on a substrate 1110 to implement counter-flow heat exchange (CFHX) in a Joule- Thomson cryocooler 1100, according to an embodiment. The substrate 1110 includes channel 1112a (corresponding to channel 1012a) to supply a non-ideal gas under pressure, nozzle 1118 (corresponding to nozzle 1018), reservoir 1116 (corresponding to reservoir 1016), and channel 1112b (corresponding to channel 1012b) to remove the exhaust low-pressure non-ideal gas.

Thermal conduction between channels is provided by depositing a thermally conductive thin layer 1120, called a thermal strap, in area 1131. In various embodiments the thermally conductive thin layer 1120 comprises polysilicon or a titanium/nickel alloy, or the other materials listed above, including gold and aluminum nitride, or some combination.

Thermal conduction along channel 1112a is interrupted by not depositing the thermally conductive thin layer 1120 along repeated sections of channel 1112a outside the area 1131, such as at the turns. However, in some embodiments, thermal conduction along channel 1112a is acceptable; and, in some such embodiments, the area 1131 is expanded to cover all parts of the channels 1112a and 1112b.

An upper insert indicates a portion of substrate 1110 outside area 1131, with channels 1112a and 112b absent the thermally conductive thin layer. Fluid flow direction is indicated by arrows 1103. A lower insert indicates a portion of substrate 1110 inside area 1131 with channels 1112a and 112b coated by the thermally conductive thin layer 1120.

Thus, in some embodiments, a system is constructed with glass substrates in which the channels are coplanar with the substrate surface and run parallel to one another in the counter-flow heat exchange region of the device. A thermal strap 1120 comprised of a thin film of metal or other material of high thermal coefficient is used to replace a select portion of the wall separating portions of channels 1112a and 112b. As a non-limiting example, such a thermal strap 1120 that is a third of the depth and one half the width of the channels 1112a and 112b affords a heat transfer advantage as much as three orders of magnitude greater than the equivalent wall made of the substrate glass alone. Using thin film deposition processing also offers an extremely precision machined, high purity counter-flow heat exchanger which can be easily integrated with any co-planar micro-cooler fabrication process. These advantages allow the designer greater flexibility in making thicker and/or stronger supportive walls separating the high and low pressure channels.

In some non-limiting examples of embodiments, the spreading of normally sharp thermal gradients is accomplished by patterning a wide thermal strap throughout the reservoir or at other locations. Phase-transition Joule-Thomson cooling involves chaotic flows and condensation patterns, which in turn create extreme divergence in heat flow patterns that have the potential to impart high levels of mechanical stress in the substrate material. In such cases, a thermal spreader circuit by use of a thermal strap would not only alleviate the stress, but can be tapped by a temperature probe to measure device condition and operability.

While particular embodiments have been described, it will be understood by those skilled in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited to the particular embodiment disclosed as the best mode contemplated, but that all embodiments falling within the scope of the appended claims are considered. Moreover, unless specifically stated, any use of the terms first, second, etc., does not denote any order or importance, but rather the terms first, second, etc., are used to distinguish one element from another.

We claim:

1. A method comprising:

etching one or more fluidic channels having at least two different portions into a first substrate made of a first material according to a first spatial pattern;

after etching the one or more fluidic channels, then separately etching a space in the first substrate according to a different second pattern that includes at least one connection between the at least two different portions of the one or more fluidic channels;

depositing a different second material into the space; and bonding a different second substrate to the first substrate to enclose the one or more fluidic channels to configure the one or more fluidic channels to contain or pass one or more fluids.

2. A method as recited in claim 1, wherein the one or more fluidic channels are microscale channels or smaller.

3. A method as recited in claim 1, wherein the first material is configured to provide a first function on the one or more fluids and the second material is configured to provide a different second function on the one or more fluids in the at least two different portions of the one or more fluid channels.

4. A method as recited in claim 3, wherein the first material thermally insulates the one or more fluids and the second material conducts heat between the one or more fluids in the at least two different portions.

5. A method as recited in claim 3, wherein the first material electrically insulates the one or more fluids and the second material conducts electricity between the one or more fluids in the different portions.

6. A method as recited in claim 3, wherein the first material confines chemical constituents within the one or more fluids and the second material diffuses at least one chemical constituent between the one or more fluids in the different portions.

7. A method as recited in claim 3, wherein the first material confines particles within the one or more fluids and the second material captures particles larger than a particular size in the one or more fluids in the different portions.

8. A method as recited in claim 1, further comprising forming an access port in the second substrate.

9. A method as recited in claim 8, wherein no access port is formed in the first substrate.

10. A method as recited in claim 1, wherein the first spatial pattern is based on a two-dimensional lithographic mask.

11. A method as recited in claim 10, wherein the first spatial pattern is based on a two-dimensional lithographic mask for use with a negative photoresist.

12. A method as recited in claim 1, wherein the second spatial pattern is based on a two-dimensional lithographic mask.

13. A method as recited in claim 12, wherein the second spatial pattern is based on a two-dimensional lithographic mask for use with a negative photoresist.

14. A method as recited in claim 1, wherein the second material is a solid after deposition.

15. A method as recited in claim 1, wherein:

the first substrate is made of a first thermally insulating material;

the second material is a thermally conducting material; and the second substrate is made of a second thermally insulating material.

16. A method as recited in claim 15, wherein:
a bonding surface of the first substrate occurs along a first plane; and
the method further comprising, before bonding the bonding surface of the first substrate to the different second substrate, applying chemical-mechanical polishing to grind the thermally conducting second material to the first plane of the bonding surface of the first substrate.

17. A method as recited in claim 15, further comprising, before bonding the different second substrate, etching one or more fluidic channels into the second substrate according to a complementary spatial pattern that causes the one or more fluidic channels in the second substrate to align with the one or more fluidic channels in the first substrate when the first substrate is bonded to the second substrate.

18. A method as recited in claim 15, wherein the first substrate and the second substrate are transparent.

19. A method as recited in claim 15, wherein the first substrate and the second substrate are glass.

20. A method as recited in claim 15, wherein the thermally conducting material is selected from a group comprising polysilicon and titanium/nickel alloys.

21. A method as recited in claim 15, further comprising, before bonding the different second substrate, depositing a sealing material on one or both of the first and second substrate.

22. A method as recited in claim 13, wherein the sealing material is gold.

* * * * *